United States Patent
Onuma et al.

(10) Patent No.: US 11,189,759 B2
(45) Date of Patent: Nov. 30, 2021

(54) LIGHT SOURCE DEVICE AND LIGHT EMITTING DEVICE

(71) Applicant: SHARP KABUSHIKI KAISHA, Osaka (JP)

(72) Inventors: Hiroaki Onuma, Sakai (JP); Tsuyoshi Ono, Sakai (JP); Takashi Ono, Sakai (JP); Hiroyoshi Higashisaka, Sakai (JP); Toshio Hata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/626,857

(22) PCT Filed: Jun. 13, 2018

(86) PCT No.: PCT/JP2018/022607
§ 371 (c)(1),
(2) Date: Dec. 26, 2019

(87) PCT Pub. No.: WO2019/009033
PCT Pub. Date: Jan. 10, 2019

(65) Prior Publication Data
US 2020/0144460 A1 May 7, 2020

(30) Foreign Application Priority Data
Jul. 3, 2017 (JP) .............................. JP2017-130685

(51) Int. Cl.
*H01L 33/50* (2010.01)
*G09G 3/32* (2016.01)
*H01L 25/075* (2006.01)
*H01L 33/32* (2010.01)
*H01L 33/58* (2010.01)

(52) U.S. Cl.
CPC ............. *H01L 33/504* (2013.01); *G09G 3/32* (2013.01); *H01L 25/0753* (2013.01); *H01L 33/32* (2013.01); *H01L 33/58* (2013.01)

(58) Field of Classification Search
CPC combination set(s) only.
See application file for complete search history.

(56) References Cited

U.S. PATENT DOCUMENTS

2006/0033423 A1 2/2006 Nishimura
2012/0193657 A1* 8/2012 von Malm ............ H01L 27/153
257/89

(Continued)

FOREIGN PATENT DOCUMENTS

JP 2006-054470 A 2/2006
JP 2015-126209 A 7/2015

(Continued)

*Primary Examiner* — Ratisha Mehta
(74) *Attorney, Agent, or Firm* — ScienBiziP, P.C.

(57) ABSTRACT

A light source device includes: a driving circuit; a blue light emitting element made of a group III nitride semiconductor which has a light outgoing surface on a side opposite to a side with the driving circuit, is arranged on the driving circuit, and is electrically connected to the driving circuit; and a color conversion layer which is in contact with the light outgoing surface and converts a wavelength of light emitted from the light outgoing surface. The light outgoing surface is made of a group III nitride semiconductor.

16 Claims, 9 Drawing Sheets

(56) References Cited

U.S. PATENT DOCUMENTS

| | | | |
|---|---|---|---|
| 2014/0285088 A1* | 9/2014 | Windisch | H01L 33/58 |
| | | | 315/113 |
| 2015/0340574 A1* | 11/2015 | Tamaki | H01L 24/97 |
| | | | 257/98 |
| 2016/0284673 A1* | 9/2016 | Kong | H01L 27/14621 |
| 2016/0351767 A1* | 12/2016 | Choi | H01L 25/167 |
| 2017/0092820 A1* | 3/2017 | Kim | H01L 33/50 |
| 2017/0303367 A1* | 10/2017 | Brueckel | F21S 41/18 |
| 2018/0358339 A1 | 12/2018 | Iguchi | |

FOREIGN PATENT DOCUMENTS

| | | |
|---|---|---|
| JP | 2017-054092 A | 3/2017 |
| WO | 2017/094461 A1 | 6/2017 |

\* cited by examiner

| | |
|---|---|
| 3: LIGHT SOURCE DEVICE | 40b: GREEN CONVERSION LAYER |
| 10: SUBSTRATE | 40c: RED CONVERSION LAYER |
| 11: DRIVING CIRCUIT | 50: RESIN |
| 20: ELECTRODE | a1: UNEVEN SURFACE |
| 30: BLUE LIGHT EMITTING ELEMENT | c1: LIGHT-TRANSMITTING RESIN |

LIGHT SOURCE DEVICE AND LIGHT EMITTING DEVICE

TECHNICAL FIELD

The present invention relates to a light source device and a light emitting device.

BACKGROUND ART

PTL 1 discloses a mixed-color light emitting element device, in which a pixelated array of light emitting elements are formed on a substrate and a phosphor is arranged above a light emitting element with a metal layer therebetween. PTL 2 discloses a light emitting device, in which light emitting elements are arranged on a substrate and a light-transmitting member containing a phosphor is provided on an upper surface of each light emitting element. In the light emitting device disclosed in PTL 2, the light emitting element and the light-transmitting member are connected by a publicly known method, such as compression bonding, sintering, or gluing with adhesive.

CITATION LIST

Patent Literature

PTL 1: Japanese Unexamined Patent Application Publication No. 2006-054470 (laid open on Feb. 23, 2006)
PTL 2: Japanese Unexamined Patent Application Publication No. 2015-126209 (laid open on Jul. 6, 2015)

SUMMARY OF INVENTION

Technical Problem

The mixed-color light emitting element device disclosed in PTL 1 has a metal layer between a light emitting element and a phosphor and thus suffers reduction in light extraction efficiency and increase in overall device size. Additionally, the thickness of a phosphor at a portion with a metal layer and that of a phosphor at a portion with no metal layer are different, and surfaces of the light emitting elements have color unevenness.

In the light emitting device disclosed in PTL 2, a light emitting element and a light-transmitting member are connected by a publicly known method, such as compression bonding, sintering, or gluing with adhesive, which results in formation of an adhesion layer between the light emitting element and the light-transmitting member. For this reason, the light emitting device suffers reduction in light extraction efficiency and increase in overall device size.

An aspect of the present invention has as its object to increase light extraction efficiency of a light source device and light emission uniformity and reduce an overall size of the light source device.

Solution to Problem

To solve the above-described problems, a light source device according to an aspect of the present invention includes: a driving circuit; a light emitting element made of a group III nitride semiconductor which has a light outgoing surface on a side opposite to a side with the driving circuit, is arranged on the driving circuit, and is electrically connected to the driving circuit; and a color conversion layer which is in contact with the light outgoing surface and converts a wavelength of light emitted from the light outgoing surface, and the light outgoing surface is made of a group III nitride semiconductor.

Also, a light source device according to an aspect of the present invention includes: a driving circuit; a light emitting element made of a group III nitride semiconductor which has a light outgoing surface on a side opposite to a side with the driving circuit, is arranged on the driving circuit, and is electrically connected to the driving circuit; a phosphor layer which is in contact with the light outgoing surface and converts a wavelength of light emitted from the light outgoing surface; and a color filter layer which is arranged on the phosphor layer, and the light outgoing surface is made of a group III nitride semiconductor.

Additionally, a light source device according to an aspect of the present invention includes: a driving circuit; a plurality of light emitting elements made of a group III nitride semiconductor, each of which has a light outgoing surface on a side opposite to a side with the driving circuit, is arranged on the driving circuit, and is electrically connected to the driving circuit; a plurality of color conversion layers, which correspond one-to-one with the plurality of light emitting elements and each of which is in contact with the light outgoing surface of the corresponding light emitting element and converts a wavelength of light emitted from the light outgoing surface of the corresponding light emitting element; and a light absorbing layer or a light reflecting layer which is arranged between the color conversion layers, and the light outgoing surface is made of a group III nitride semiconductor.

Advantageous Effects of Invention

An aspect of the present invention can attain the effect of increasing light extraction efficiency of a light source device and light emission uniformity and reducing an overall size of the light source device.

BRIEF DESCRIPTION OF DRAWINGS

FIG. 1(a) is a view showing a case where each color conversion layer has the shape of a rectangular parallelepiped, FIG. 1(b) is a view showing, in top view, the light source device, FIG. 1(c) is a side view of the light source device, FIG. 1(d) is a view showing a case where the area of a lower surface of each color conversion layer is larger than that of an upper surface of the color conversion layer, and FIG. 1(e) is a view showing a case where each color conversion layer has a rounded shape with no sharp edges at the upper surface.

FIG. 2(a) is a view showing a case where a light source device includes color conversion layers, FIG. 2(b) is a view showing a case where a light source device includes a resin, FIG. 2(c) is a view showing, in top view, the light source device shown in FIG. 2(b), FIG. 2(d) is a side view of the light source device shown in FIG. 2(c), FIG. 2(e) is a view showing a case where a light source device includes a fixing resin, and FIG. 2(f) is a view showing a case where a light source device includes three types of color conversion layers.

FIG. 4(a) is a view showing a case where a light source device includes a light-transmitting resin, FIG. 4(b) is a view showing a case where the light-transmitting resin covers side surfaces and an upper surface of each color conversion layer, and FIG. 4(c) is a view showing a light source device obtained by removing the light-transmitting resin from the light source device shown in FIG. 4(a).

FIG. 5(a) is a view showing a case where color conversion layers of a light source device have different thicknesses, FIG. 5(b) is a view showing, in top view, the light source device shown in FIG. 5(a), FIG. 5(c) is a side view of the light source device shown in FIG. 5(b), and FIG. 5(d) is a view showing a case where color conversion layers of a light source device have different widths.

FIG. 7(a) is a view showing a case where a light source device includes color filter layers, FIG. 7(b) is a view showing a case where the color filter layers have different thicknesses, FIG. 7(c) is a view showing a case where color filter layers cover color conversion layers, and FIG. 7(d) is a view showing a case where the color conversion layers have different thicknesses.

FIG. 8(a) is a view showing a case where one yellow conversion layer covers three blue light emitting elements, FIG. 8(b) is a view showing a case where color filter layers have different thicknesses and different widths, FIG. 8(c) is a view showing a case where the color filter layers have different thicknesses, FIG. 8(d) is a view showing, in top view, a light source device shown in FIG. 8(c), FIG. 8(e) is a side view of the light source device shown in FIG. 8(d), and FIG. 8(f) is a view showing a case obtained by replacing the color conversion layer of the light source device shown in FIG. 8(c).

DESCRIPTION OF EMBODIMENTS

First Embodiment

Figure 1:
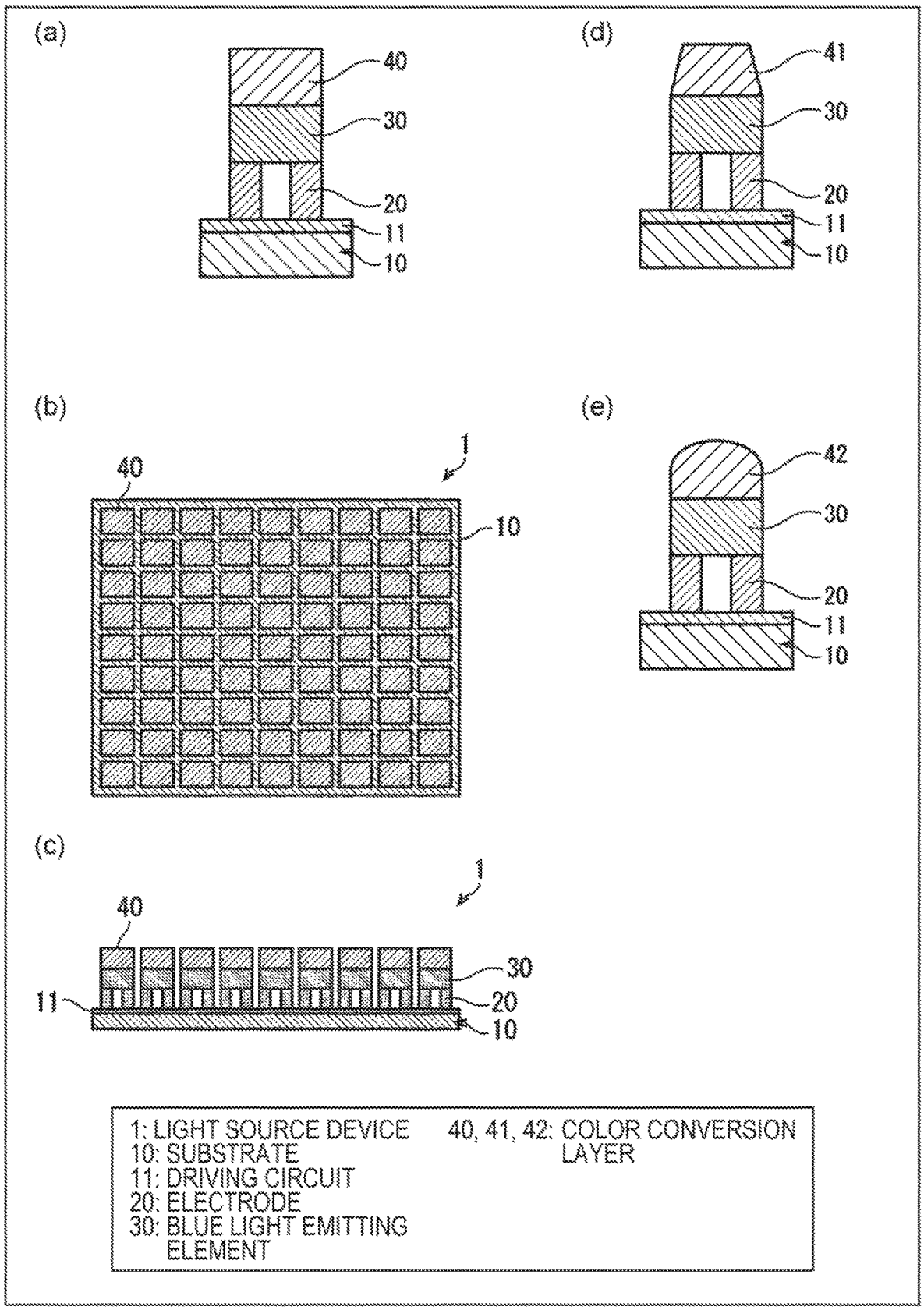
FIG. 1 illustrates views showing the shapes of color conversion layers of a light source device according to a first embodiment of the present invention and the structure of the light source device.
Figure 2:
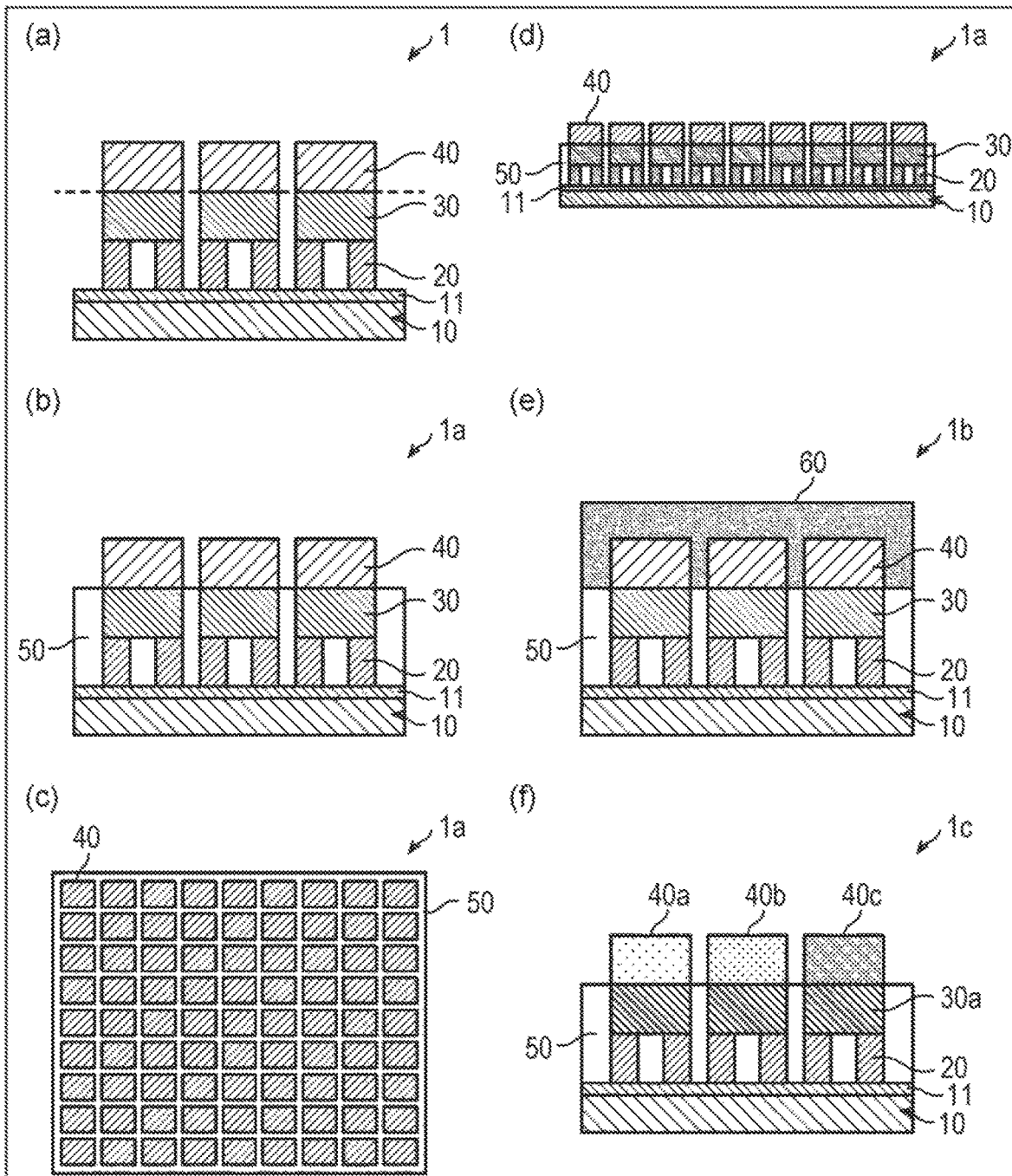
FIG. 2 illustrates views showing, in cross-section and top view, light source devices according to the first embodiment of the present invention.

An embodiment of the present invention will be described with reference to FIGS. 1 to 6 as follows. FIG. 1 illustrates views showing the shapes of color conversion layers 40 to 42 of a light source device 1 according to a first embodiment of the present invention, and the structure of the light source device 1. FIG. 2 illustrates views showing, in cross-section and top view, light source devices 1 to 1c according to the first embodiment of the present invention.

As shown in FIG. 1(a), the light source device 1 includes a substrate 10, electrodes 20, blue light emitting elements 30, and the color conversion layers 40. As shown in FIGS. 1(b) and 1(c), the individual blue light emitting elements 30 in the light source device 1 may be an array (structure) arranged in the pattern of an m×n (m and n are natural numbers) grid on the substrate 10. In the array, the blue light emitting elements 30 may be arranged at equal spaces (with equal spacing). More specifically, for example, the distance between each adjacent two of the blue light emitting elements 30 may be the same.

As the substrate 10, a substrate with wiring formed such that at least a surface thereof is connectable to the blue light emitting element 30 can be used. The substrate 10 may be made of, for example, silicon, germanium, silicon carbide, or an In—Ga—Zn—O-based substance. The substrate 10 may have a single-layer structure or a layered structure. The substrate 10 includes a driving circuit 11, and the driving circuit 11 may be provided, for example, on an upper surface of the substrate 10. The driving circuit 11 controls turn-on/turn-off of the blue light emitting element 30. If a plurality of blue light emitting elements 30 are arranged at the substrate 10, the driving circuit 11 may individually control the blue light emitting elements 30. The blue light emitting element 30 is connected to the upper surface of the substrate 10 via the electrode 20. The arrangement of the driving circuit 11 immediately below the blue light emitting elements 30 allows reduction in the area of the light source device 1 in top view and implementation of the smaller light source device 1 (a light emitting device (to be described later)). The arrangement of the driving circuit 11 immediately below the blue light emitting elements 30 also allows reduction in wiring capacity and resistance between the blue light emitting elements 30 and the driving circuit 11 and manufacture of the light source device 1 (a light emitting device) with a smaller delay.

FIGS. 2 to 9 are focused on three blue light emitting elements 30 close to one another out of the plurality of blue light emitting elements 30 arranged in the light source device 1 for convenience of description. As shown in FIG. 2(a), three blue light emitting elements 30 may be connected to the upper surface of the substrate 10 via the electrodes 20 in the light source device 1. The electrode 20 will be described later. In the light source device 1, light outgoing surfaces (upper surfaces) of the three blue light emitting elements 30 lie in substantially the same plane. This configuration allows easy application of the color conversion layers 40 to the light outgoing surfaces of the blue light emitting elements 30.

The substrate 10 has a circuit for driving the blue light emitting elements 30. Since the electrodes 20 and electrodes of the blue light emitting elements 30 are joined above the substrate 10, the substrate 10 and the blue light emitting elements 30 are electrically joined.

As an example of the blue light emitting element 30, one which is publicly known, specifically a semiconductor light emitting element (for example, a group III-V compound semiconductor), can be used. A GaN-based semiconductor which is a group III nitride semiconductor, in particular, is preferable as the blue light emitting element 30 because the GaN-based semiconductor is capable of emitting short-wavelength light which can efficiently excite a fluorescent substance. The blue light emitting element 30 may be made of a group III nitride semiconductor and may be made of, for example, a GaN-based material and an InGaN-based material. The blue light emitting element 30 may be, for example, a blue light emitting diode (LED) in which a p-type GaN layer, an InGaN layer, and an n-type GaN layer having a light outgoing surface on a side opposite to a side with the substrate 10 are arranged in this order. Alternatively, the blue light emitting element 30 may be a blue laser. The blue light emitting element 30 is of a flip chip type. Use of the blue light emitting element 30 of the flip chip type allows application of a large current and implementation of the high-luminance light source device 1. That is, no electrode is provided at the light outgoing surface of the blue light emitting element 30, and the light outgoing surface of the blue light emitting element 30 may be made of a group III nitride semiconductor (for example, a GaN-based material).

One which is obtained by using a sapphire substrate as a growth substrate 18 (to be described later) and peeling the sapphire substrate can be used as the blue light emitting element 30. The growth substrate 18 may be made of silicon, GaN, AlN, AlGaN, or the like. The emission peak wavelength of the blue light emitting element 30 is 380 to 490 nm, more preferably 440 to 470 nm. The blue light emitting element 30 is a light emitting chip, and the area of a light emitting surface thereof is not more than 1500 $\mu m^2$ (for example, a chip whose light emitting surface has a size of 20 $\mu m \times 60$ $\mu m$ or a chip whose light emitting surface has a size of 15 $\mu m \times 45$ $\mu m$), preferably not more than 450 $\mu m^2$ (for example, a chip whose light emitting surface has a size of 12 $\mu m \times 36$ $\mu m$ or a chip whose light emitting surface has a size of 8 $\mu m \times 24$ $\mu m$), more preferably not more than 100 $\mu m^2$ (for example, a chip whose light emitting surface has a size of 5 $\mu m \times 15$ $\mu m$ or a chip whose light emitting surface has a size of 2 $\mu m \times 6$ $\mu m$). A reduction in the size of the blue light emitting element 30 allows manufacture of the smaller, higher-definition light source device 1. The distance between the blue light emitting elements 30 is not more than 20 $\mu m$, preferably not more than 5 $\mu m$, more preferably not more than 2 $\mu m$. The size of the blue light emitting element 30 and the distance between the blue light emitting elements 30 are determined by a device size desired for a light emitting device (to be described later) and the resolution of a display image.

The color conversion layer 40 is in direct contact with the light outgoing surface of the blue light emitting element 30 and converts the wavelength of light output from the light outgoing surface of the blue light emitting element 30. More specifically, for example, the color conversion layer 40 may be in contact with the light outgoing surface of the blue light emitting element 30, convert the wavelength of light emission from the blue light emitting element 30 arranged immediately underneath the color conversion layer 40, and output yellow light. That is, the color conversion layer 40 may be a yellow conversion layer containing a yellow phosphor and/or a light absorbing material which is a color conversion material. The light absorbing material may be a material, such as a coloring matter used in a color filter for liquid crystal display or a color resist for image sensor. By including, in the color conversion layer 40, a light absorbing material in addition to a phosphor, finer optical spectrum control can be performed. The color conversion layer 40 contains, for example, $Y_3Al_5O_{12}$:$Ce^{3+}$ as a yellow phosphor. If there are three blue light emitting elements 30, as shown in FIG. 2(*a*), the color conversion layers 40 are arranged on the respective light outgoing surfaces of the three blue light emitting elements 30. The color conversion layer 40 may be formed by, for example, kneading epoxy resin, silicon resin, and acrylic resin with a phosphor. The resins are for holding a phosphor in the color conversion layer 40. The material for a phosphor to be contained in the color conversion layer 40 may be, for example, one of (1) to (4) shown below.

(1) An oxide phosphor activated with trivalent cerium which is represented by $(MI)_{3-x1}Ce_{x1}(MII)_5O_{12}$ (MI indicates at least one of Y, Lu, Gd, and La, MII indicates at least one of Al and Ga, and x1 satisfies $0.005 \leq x1 \leq 0.20$).

(2) A divalent europium-activated silicate phosphor which is represented by $(MIII)_{2-x2}Eu_{x2}SiO_4$ (MIII indicates at least one of Mg, Ca, Sr, and Ba, and x2 satisfies $0.03 \leq x2 \leq 0.20$).

(3) A nitride phosphor activated with trivalent cerium which is represented by $(MIV)_{3-x3}Ce_{x3}Si_6N_{11}$ (MIV indicates at least one of Lu, Y, La, and Gd, and x3 satisfies $0.01 < x3 \leq 0.2$).

(4) An oxynitride phosphor activated with divalent europium which is α-SiAlON represented by $[Eu_{x4}(MV)_{1-x4}]_{a1}Si_{b1}Al_{c1}O_{d1}N_{e1}$ (a1 satisfies $0.15 \leq a1 \leq 1.5$, x4 satisfies $0 \leq x4 \leq 1$, b1 and c1 satisfy b1+c1=12, d1 and e1 satisfy d1+e1=16, and MV indicates at least one of Li, Na, K, Rb, Cs, Mg, Ca, Sr, Ba, Sc, Y, La, and Gd).

The color conversion layer 40 may be a color conversion layer which outputs light of a color different from that of yellow light. The color conversion layer 40 may be a color conversion layer containing a green phosphor or a red phosphor or a color conversion layer with a mixture of a green phosphor and a red phosphor. Note that although a violet light emitting element 30*a* may be used as a light emitting element instead of the blue light emitting element 30 in embodiments (to be described later), a color conversion layer may be constructed using one of the above-described yellow phosphors singly or in combination with another phosphor even in that case. Alternatively, each color conversion layer can be constructed by including not only a phosphor but also a color absorbing material in the color conversion layer.

The sizes of color conversion materials, such as a phosphor and a light absorbing material, contained in the color conversion layer 40 are not more than 2 $\mu m$ in terms of median diameter, preferably not more than 0.5 $\mu m$, more preferably not more than 0.2 $\mu m$. The sizes of the phosphor and the light absorbing material contained in the color conversion layer 40 are smaller than that of the light emitting surface of the blue light emitting element 30. Additionally, the sizes of the phosphor and the light absorbing material contained in the color conversion layer 40 are smaller than the distance between the blue light emitting elements 30 arranged at the substrate 10. If the sizes of the phosphor and the light absorbing material contained in the color conversion layer 40 are not more than 0.5 $\mu m$ in terms of median diameter, the Brownian motion is more vigorous than the gravitational motion, which allows inhibition of spontaneous sedimentation of the phosphor and the light absorbing material contained in the color conversion layer 40. If the sizes of the phosphor and the light absorbing material contained in the color conversion layer 40 are not more than 0.2 $\mu m$ in terms of median diameter, the color conversion layer 40 can be densely packed with the phosphor or the light absorbing material, and the thickness of the color conversion layer 40 can be reduced. The thickness refers to a thickness along a direction from the substrate 10 toward the blue light emitting element 30. The thickness of the color conversion layer 40 is not more than 30 $\mu m$, preferably not more than 10 $\mu m$, more preferably not more than 4 $\mu m$. The smaller the thickness of the color conversion layer 40 is, the smaller the impact of light emission from the blue light emitting element 30 located below the color conversion layer 40 adjacent to the color conversion layer 40 is. The width of the color conversion layer 40 is equal to that of the blue light emitting element 30 or larger than that of the blue light emitting element 30. The width refers to a width along a direction orthogonal to the direction from the substrate 10 toward the blue light emitting element 30.

The shape of the color conversion layer 40 may be the shape of a rectangular parallelepiped, as shown in FIG. 1(*a*). The color conversion layer 41 may be arranged on the light outgoing surface of the blue light emitting element 30 instead of the color conversion layer 40, as shown in FIG.

1(d). The color conversion layer 41 is different in shape from the color conversion layer 40. As for the shape of the color conversion layer 41, the area of a lower surface of the color conversion layer 41 is larger than that of an upper surface of the color conversion layer 41. Additionally, the color conversion layer 42 may be arranged on the light outgoing surface of the blue light emitting element 30 instead of the color conversion layer 40, as shown in FIG. 1(e). The color conversion layer 42 is different in shape from the color conversion layer 40. The shape of the color conversion layer 42 is a rounded shape without sharp edges at an upper surface of the color conversion layer 42. A color conversion layer in the shape of one of a circular column, a polygonal column, a truncated cone, a truncated polygonal pyramid, and a hemisphere, such as the color conversion layer 41 or the color conversion layer 42, may be arranged on the light outgoing surface of the blue light emitting element 30 instead of the color conversion layer 40. Alternatively, a color conversion layer in an uneven shape with the shapes of a circular column, a polygonal column, a truncated cone, a truncated polygonal pyramid, and a hemisphere lined up may be arranged on the light outgoing surface of the blue light emitting element 30. This configuration allows increase in light components emitted in a direction toward immediately above the blue light emitting element 30. To increase light extraction efficiency or control light distribution characteristics, color conversion layers in a plurality of types of shapes may be arranged on the blue light emitting elements 30.

The concentrations of a phosphor and a light absorbing material in the color conversion layer 40 are not less than 10 wt %, preferably not less than 25 wt %. Increase in the concentrations of the phosphor and the light absorbing material in the color conversion layer 40 allows reduction in the thickness of the color conversion layer 40. Since the reduction in the thickness of the color conversion layer 40 reduces light components output to the adjacent color conversion layer 40, light rays output from the separate color conversion layers 40 can be inhibited from being mixed. The phosphor and the light absorbing material may have concentration gradients in the color conversion layer 40. When the concentrations of the phosphor and the light absorbing material are higher on a lower surface side of the color conversion layer 40, a path for dissipating heat to the blue light emitting element 30 is shorter. Since this increases dissipation of heat generated from the phosphor and the light absorbing material entailed in color conversion, color conversion performance of the phosphor and the light absorbing material can be enhanced. Additionally, kneading of each color conversion layer with an alumina, silica, or titania filler allows control of the light distribution characteristics and increase in the light extraction efficiency.

The light source device 1a is different from the light source device 1 in inclusion of a resin 50 (a light blocking layer), as shown in FIGS. 2(b) to 2(d). The resin 50 fixes the blue light emitting elements 30 and the electrodes 20 to the substrate 10. The resin 50 has a light blocking function of blocking light emitted from side surfaces of the blue light emitting elements 30 and light output from the color conversion layers 40 and may be made of a material which absorbs or reflects light. The light blocking ratio of the resin 50 is preferably not less than 50%. The color of the resin 50 is close to black if the resin 50 is a material which absorbs light and is close to white if the resin 50 is a material which reflects light. The resin 50 is also called an underfill material and can be formed by, for example, curing liquid resin. The resin 50 is stuffed in a region including at least an upper portion of the substrate 10, the side surfaces of the blue light emitting elements 30, and side surfaces of the electrodes 20 in the light source device 1a. The light outgoing surfaces of the three blue light emitting elements 30 and an upper surface of the resin 50 lie in substantially the same plane.

The provision of the resin 50 in the light source device 1a has the effects to be described below. More specifically, the probability that, when light from each blue light emitting element 30 is subjected to color conversion by a color conversion layer on the blue light emitting element 30, the light of the blue light emitting element 30 is subjected to color conversion by a color conversion layer located on the blue light emitting element 30 adjacent to that blue light emitting element 30 decreases. This allows obtainment of a sharp image. Additionally, strength with which the blue light emitting element 30 is held increases to extend the life of the light source device 1a. In addition, since the light outgoing surface of the blue light emitting element 30 and the upper surface of the light blocking layer lie in substantially the same plane, each color conversion layer can be easily formed.

The light source device 1b is different from the light source device 1a in inclusion of a fixing resin 60, as shown in FIG. 2(e). The fixing resin 60 fixes each color conversion layer 40 to the blue light emitting element 30 and the resin 50. The fixing resin 60 covers side surfaces and upper surfaces of the color conversion layers 40 and the upper surface of the resin 50. To give high priority to increase in the light extraction efficiency, the transmittance of the fixing resin 60 is desirably high for wavelengths of light output from the blue light emitting elements 30 and the color conversion layers 40. To change light distribution characteristics or change hardness, the fixing resin 60 can be kneaded with a filler of alumina, silica, and/or titania. Light extraction efficiency and the light distribution characteristics can be changed by changing a surface shape to, for example, an uneven shape.

The light source device 1c is different from the light source device 1a in that the three blue light emitting elements 30 have been replaced with three violet light emitting elements 30a, as shown in FIG. 2(f). The light source device 1c is also different from the light source device 1a in that the three color conversion layers 40 have been replaced with a blue conversion layer 40a, a green conversion layer 40b, and a red conversion layer 40c, respectively. While the light source device 1 uses one type of color conversion layer, the light source device 1c uses three types of color conversion layers. For example, the blue conversion layer 40a contains $Sr_5(PO_4)_3Cl:Eu^{2+}$ as a blue phosphor, the green conversion layer 40b contains $(Ba,Sr)_2SiO_4:Eu^{2+}$ as a green phosphor, and the red conversion layer 40c contains $Ca_2SiO_4:Eu^{2+}$ as a red phosphor. A light source device according to an aspect of the present invention may use two or more types of color conversion layers such that light after conversion has different wavelengths. This allows emission of various types of light. The blue conversion layer 40a, the green conversion layer 40b, and the red conversion layer 40c may be different in the concentration of a color conversion material (a phosphor or a light absorbing material, such as a coloring matter). Since the concentrations of color conversion materials in color conversion layers differ depending on the type of the color conversion layer, it is possible to, for example, set an appropriate color conversion material concentration for each color and output optimum light.

A plurality of types of phosphors and/or a light absorbing material may be included in one color conversion layer. For example, to balance light extraction efficiency and the color of light emission, the red conversion layer 40c may be formed using $K_2SiF_6$:$Mn^{4+}$ and $CaAlSiN_3$:$Eu^{2+}$ in combination. $K_2SiF_6$:$Mn^{4+}$ has an emission peak wavelength around 630 nm having a half-value width of 10 nm or less, and $CaAlSiN_3$:$Eu^{2+}$ has an emission peak wavelength around 650 nm having a half-value width within a range of about 90 to 105 nm. As described above, a color conversion layer containing a plurality of types of phosphors and/or a light absorbing material allows formation of a spectrum of light output from the color conversion layer.

As an example of the violet light emitting element 30a, one which is publicly known, specifically a semiconductor light emitting element, can be used, as in the blue light emitting element 30. A GaN-based semiconductor which is a group III nitride semiconductor, in particular, is preferable as the violet light emitting element 30a because the GaN-based semiconductor is capable of emitting short-wavelength light which can efficiently excite a fluorescent substance. The violet light emitting element 30a may be made of a group III nitride semiconductor and may be made of, for example, a GaN-based material and an InGaN-based material. That is, no electrode is provided at a light outgoing surface of the violet light emitting element 30a, and the light outgoing surface of the violet light emitting element 30a may be made of a group III nitride semiconductor (for example, a GaN-based material). The violet light emitting element 30a may be, for example, a violet LED in which a p-type GaN layer, an InGaN layer, and an n-type GaN layer having a light outgoing surface on a side opposite to a side with the substrate 10 are arranged in this order. The emission peak wavelength of the violet light emitting element 30a is 365 to 420 nm, preferably 390 to 420 nm.

The blue conversion layer 40a is arranged on the light outgoing surface (an upper surface) of one of the three violet light emitting elements 30a, converts the wavelength of light emission from the violet light emitting element 30a arranged immediately underneath the blue conversion layer 40a, and outputs blue light. The material for a phosphor to be contained in the blue conversion layer 40a may be, for example, one of (5) to (7) shown below.

(5) A phosphorus oxide phosphor activated with divalent europium which is represented by $(MVI)_{5-x5}Eu_{x5}(PO_4)_3$(MVII) (MVI indicates at least one of Ca, Sr, and Ba, MVII indicates at least one of F, Cl, and Br, and x5 satisfies $0.1 \leq x5 \leq 1.5$).

(6) An aluminum oxide phosphor activated with divalent europium which is represented by $(MVIII)_{1-x6}Eu_{x6}MgAl_{10}O_{17}$ (MVIII indicates at least one of Sr and Ba, and x6 satisfies $0.005 \leq x6 \leq 0.2$).

(7) A nitride phosphor activated with trivalent cerium which is represented by $(MIX)_{1-x7}Ce_{x7}Si_3N_5$ (MIX indicates at least one of Lu, Y, La, and Gd, and x7 satisfies $0.005 \leq x7 \leq 0.2$).

The green conversion layer 40b is arranged on the light outgoing surface of one of the three violet light emitting elements 30a, converts the wavelength of light emission from the violet light emitting element 30a arranged immediately underneath the green conversion layer 40b, and outputs green light. The material for a phosphor to be contained in the green conversion layer 40b may be one of (8) to (15) shown below.

(8) An oxynitride phosphor activated with divalent europium which is β-SiAlON represented by $Eu_{x8}Si_fAl_gO_hN_i$ ($0.001 \leq x8 \leq 0.2$).

(9) An oxide phosphor having a garnet crystal structure and activated with trivalent cerium which is represented by $(MX)_{3-x9}Ce_{x9}(MXI)_5O_{12}$ (MX indicates at least one of Lu, Y, La, and Gd, MXI indicates at least one of Al and Ga, and x9 satisfies $0.005 \leq x9 \leq 0.3$).

(10) A phosphor (a silicate phosphor activated with divalent europium) which is represented by $(MXII)_{2-x10}Eu_{x10}SiO_4$ (MXII indicates at least one of Mg, Ca, Sr, and Ba, and x10 satisfies $0.005 \leq x10 \leq 0.4$).

(11) A silicate phosphor activated with trivalent cerium which is represented by $(MXIII)_{3-x11}Ce_{x11}(MXIV)_2Si_3O_{12}$ (MXIII indicates at least one of Mg, Ca, Sr, and Ba, and MXIV indicates at least one of Li, Na, K, Cs, Rb, Mg, Ca, Ba, Al, Ga, In, Sc, Y, La, Gd, and Lu, and x11 satisfies $0.005 \leq x11 \leq 0.3$).

(12) A nitride phosphor activated with trivalent cerium which is represented by $(MXV)_{3-x12}Ce_{x12}Si_6N_{11}$ (MXV indicates at least one of Lu, Y, La, and Gd, and x12 satisfies $0.005 \leq x12 \leq 0.2$).

(13) An aluminate phosphor activated with divalent europium and divalent manganese which is represented by $(MXVI)_{1-y1}Eu_{y1}Mg_{1-x13}Al_{10-x13}Mn_{x13+y1}O_{17}$ (MXVI indicates at least one of Sr and Ba, y1 satisfies $0.005 \leq y1 \leq 0.2$, and x13 and y1 satisfy $0.005 \leq x13+y1 \leq 0.2$).

(14) A silicate phosphor activated with divalent europium and divalent manganese which is represented by $(MXVII)_{3-x14}Eu_{x14}Si_6O_{12}N_2$ (MXVII indicates at least one of Sr and Ba, and x14 satisfies $0.005 \leq x14 \leq 0.2$).

(15) A divalent europium-activated silicate phosphor which is represented by $(MXVIII)_{2-x15}Eu_{x15}SiO_4$ (MXVIII indicates at least one of Mg, Ca, Sr, and Ba, and x15 satisfies $0.03 \leq x15 \leq 0.10$).

The red conversion layer 40c is arranged on the light outgoing surface of one of the three violet light emitting elements 30a, converts the wavelength of light emission from the violet light emitting element 30a arranged immediately underneath the red conversion layer 40c, and outputs red light. The material for a phosphor to be contained in the red conversion layer 40c may be one of (16) to (21) shown below.

(16) A nitride phosphor activated with divalent europium which is represented by $(MXIX)_{1-x16}Eu_{x16}(MXX)SiN_3$ (MXIX indicates at least one of Mg, Ca, Sr, and Ba, MXX indicates at least one of Al, Ga, In, Sc, Y, La, Gd, and Lu, and x16 satisfies $0.005 \leq x16 \leq 0.2$).

(17) A nitride phosphor activated with divalent europium which is represented by $(MXXI)_{2-x7}Eu_{x17}Si_5N_8$ (MXXI indicates at least one of Mg, Ca, Sr, and Ba, and x17 satisfies $0.005 \leq x17 \leq 0.2$).

(18) An oxynitride phosphor activated with divalent europium which is α-SiAlON represented by $[Eu_{x18}(MXXII)_{1-x18}]_{a2}Si_{b2}Al_{c2}O_{d2}N_{e2}$ (a2 satisfies $0.15 \leq a2 \leq 1.5$, x18 satisfies $0 \leq x18 \leq 1$, b2 and c2 satisfy $b2+c2=12$, d2 and e2 satisfy $d2+e2=16$, MXXII indicates at least one of Li, Na, K, Rb, Cs, Mg, Ca, Sr, Ba, Sc, Y, La, and Gd).

(19) A fluoride metal salt phosphor activated with tetravalent manganese which is represented by $(MXXIII)_2((MXXIV)_{1-x19}Mn_{x19})F_6$ (MXXIII indicates at least one of Li, Na, K, Rb, and Cs, MXXIV indicates at least one of Ge, Si, Sn, Ti, and Zr, and x19 satisfies $0.005 \leq x19 \leq 0.3$).

(20) A sulfur oxide phosphor activated with trivalent europium which is represented by $(MXXV)_{2-x20}Eu_{x20}O_{3-y2}S_{y2}$ (MXXV indicates at least one of Y, La, and Gd, x20 satisfies $0.005 \leq x20 \leq 0.4$, and y2 satisfies $0.0 \leq y2 \leq 2.0$).

(21) An oxide phosphor activated with divalent europium which is represented by $Ca_{2-x21}Eu_{x21}SiO_4$ (x21 satisfies $0.5 \leq x21 \leq 1.5$).

Although the blue light emitting element 30 may be used as a light emitting element instead of the violet light emitting element 30a in the embodiments (to be described later), one of the above-described green phosphors or one of the above-described red phosphors can be used in that case. A phosphor to be contained in each color conversion layer is not limited to the above-described ones, and each color conversion layer can be constructed by including, in the color conversion layer, a plurality of phosphors not limited to one of the color of light emission. Additionally, each color conversion layer can be constructed by including, in the color conversion layer, not only a phosphor but also a color absorbing material. Kneading of each color conversion layer with a filler of alumina, silica, and/or titania or changing of the surface shape of the color conversion layer allows control of the light distribution characteristics of the color conversion layer and increase in the light extraction efficiency. Note that the surface shape of each color conversion layer may be the shape of a cone, the shape of a polygonal pyramid, the shape of a truncated cone, the shape of a truncated polygonal pyramid, or the shape of a hemisphere. Alternatively, the surface shape may be an uneven shape with the shape of a cone, the shape of a polygonal pyramid, the shape of a truncated cone, the shape of a truncated polygonal pyramid, and the shape of a hemisphere lined up. To increase the light extraction efficiency of each color conversion layer or control the light distribution characteristics, color conversion layers in a plurality of types of shapes may be arranged on the blue light emitting elements 30.

(Method for Manufacturing Light Source Device 1)

Figure 3:
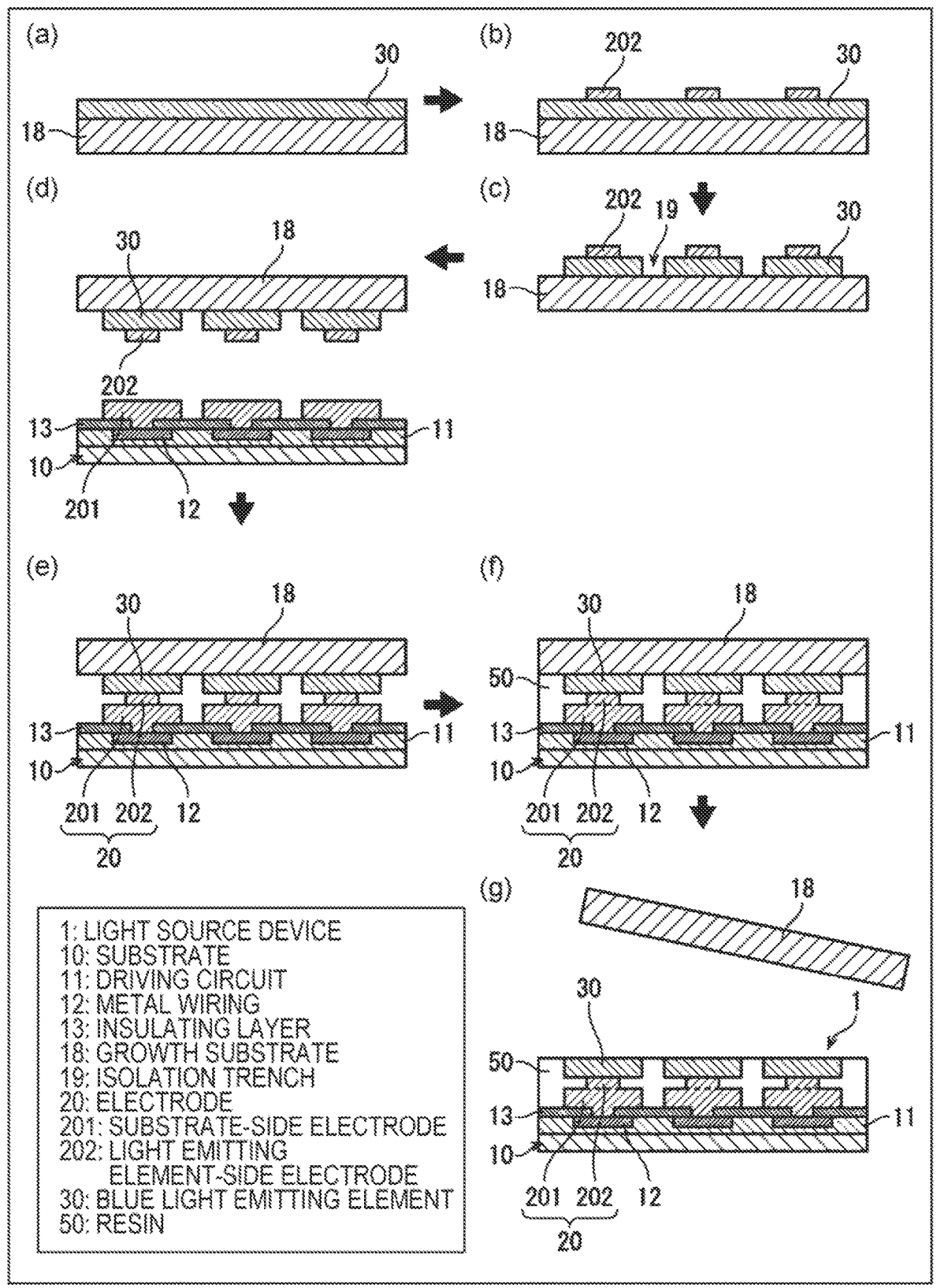
FIG. 3 illustrates views showing a method for manufacturing the light source device shown in FIG. 2.

A method for manufacturing the light source device 1 will next be described with reference to FIG. 3. FIG. 3 illustrates views showing the method for manufacturing the light source device 1. Before describing the method for manufacturing the light source device 1, the electrode 20 and metal wiring 12 will be described.

The electrode 20 is, for example, an electrode made of gold (Au) or Au—Sn (a surface thereof is made of Au) and is intended to electrically connect the substrate 10 and the blue light emitting element 30. More specifically, the electrode 20 functions as a pad electrode which electrically connects the metal wiring 12 and a metal terminal (not shown) provided at a surface of the blue light emitting element 30 and is also called a bump.

The metal wiring 12 is wiring including at least a control circuit which supplies a control voltage to the blue light emitting element 30. A first portion to be connected to the metal wiring 12 in the electrode 20 is a substrate-side electrode 201 while a second portion to be connected to the metal terminal (not shown) provided at the surface of the blue light emitting element 30 in the electrode 20 is a light emitting element-side electrode 202.

(Process of Forming Blue Light Emitting Element 30)

As shown in FIG. 3(a), the blue light emitting element 30 is first provided on the growth substrate 18. The growth substrate 18 is a substrate, on which a semiconductor layer for the blue light emitting element 30 is to be epitaxially grown. As a substrate of a group III-V compound semiconductor and a group III nitride semiconductor, a publicly known one can be used. As the group III-V compound semiconductor and the group III nitride semiconductor, publicly known semiconductors can be used.

(Process of Forming Light Emitting Element-Side Electrode 202)

After formation of the blue light emitting element 30, a plurality of light emitting element-side electrodes 202 are formed on the blue light emitting element 30, as shown in FIG. 3(b). A well-known common electrode forming technique is used for the formation. A typical material for the light emitting element-side electrode 202 is, for example, gold (Au).

(Process of Forming Isolation Trench 19)

After formation of the light emitting element-side electrodes 202, a plurality of isolation trenches 19 are formed in the blue light emitting element 30, as shown in FIG. 3(c). A standard semiconductor selective etching process is used for the formation. In FIG. 3, the isolation trench 19 is formed between the adjacent light emitting element-side electrodes 202. The isolation trench 19 to be formed extends to a surface of the growth substrate 18. With the formation of the isolation trenches 19, the one blue light emitting element 30 is divided into a plurality of individual blue light emitting elements 30 at the surface of the growth substrate 18.

(Process of Aligning Two Substrates)

After the formation of the isolation trenches 19, the substrate 10, on which the pieces of metal wiring 12, an insulating layer 13, and substrate-side electrodes 201 are formed in advance and which has the driving circuit 11, is prepared, as shown in FIG. 3(d). The insulating layer 13 is an insulative layer which is composed of an oxide film, a resin film, and a resin layer. The insulating layer 13 prevents direct contact of the substrate 10 with the electrode 20. A well-known common electrode forming technique is used to form the substrate-side electrode 201 for the substrate 10. A typical material for the substrate-side electrode 201 is, for example, gold (Au). In parallel with the preparation of the substrate 10, the growth substrate 18 is flipped, as shown in FIG. 3(d). After the flip, the substrate 10 and the growth substrate 18 are aligned such that each substrate-side electrode 201 and the light emitting element-side electrode 202 face.

(Process of Bonding Substrate 10)

After completion of the alignment, the substrate 10 and the growth substrate 18 are bonded together, as shown in FIG. 3(e). At this time, an existing bonding technique is used to hold the substrate 10 and the growth substrate 18 from above and below through pressurization such that the substrate-side electrode 201 and the light emitting element-side electrode 202 corresponding to each other are joined. Additionally, the responsiveness of the substrate-side electrode 201 and the light emitting element-side electrode 202 can be increased by processing that heats the substrate 10 during the process of bonding the substrate 10 or a clean surface of the electrode 20 can be exposed by, for example, plasma processing before the bonding of the substrate 10. The processing that heats the substrate 10 and the plasma processing allow tighter joining of the corresponding substrate-side electrode 201 and light emitting element-side electrode 202. As described above, the corresponding substrate-side electrode 201 and light emitting element-side electrode 202 are integrated to constitute the electrode 20.

(Process of Forming Resin 50)

After completion of the bonding process, a liquid resin 50a is charged into a void formed between the substrate 10 and the growth substrate 18. A state after the charging is shown in FIG. 3(f). At the time of the charging, for example, the bonded combination of the substrate 10 and the growth substrate 18 in a state after the bonding may be put in a container filled with the liquid resin 50a. Examples of a chief material for the liquid resin 50a include, but are not limited to, an epoxy resin. Note that a method for injecting the liquid resin 50a other than the above-described one may be a method that injects the liquid resin 50a with an injection needle, especially a microneedle sized to fit into a void formed between the substrate 10 and the blue light emitting elements 30. A metal, a plastic, or the like is used as the material for the injection needle in this case.

In the charging process, the liquid resin 50a is preferably charged under a temperature within a temperature range of 50° C. to 200° C. This makes it possible to normally charge the liquid resin 50a into the void. The temperature range more preferably extends from 80° C. to 170° C. This allows reduction in the risk of impairing properties (for example, adhesion and heat dissipation after a curing process) of the resin 50. The temperature range still more preferably extends from 100° C. to 150° C. This makes it possible to reduce air bubbles and the like generated in the void, fully fill the void without occurrence of convection and the like, and easily manufacture the light source device 1.

Consider, in particular, a case where the size of the individual blue light emitting element 30 is set, for example, such that a length and a width are not more than 20 µm, more preferably several µm to 10-odd µm, and the thickness of the blue light emitting element 30 is set as small as around 10 µm (2 µm to 15 µm). In this case, the liquid resin 50a functions more usefully as a reinforcement member for increase in fixing strength in a substrate peeling process and a post-peeling process. Since variation in properties of the resin 50 between products can be reduced, the light source device 1 can be easily manufactured. The products each refer to a product in which the size of the individual blue light emitting element 30 is such that a length and a width are not more than 20 µm in top view, more preferably several µm to 10-odd µm.

The liquid resin 50a charged into the void is completely stuffed in the void, as shown in FIG. 3(f). With this configuration, the liquid resin 50a is stuffed to fit on the side surfaces of the blue light emitting elements 30, the side surfaces and stepped surfaces of the electrodes 20, and the upper portion of the substrate 10. After completion of the charging of the liquid resin 50a, the liquid resin 50a is cured. Note that although a method for curing the liquid resin 50a is not particularly limited, the liquid resin 50a may be cured through, for example, heating the liquid resin 50a or radiating ultraviolet light to the liquid resin 50a.

(Process of Peeling Growth Substrate 18)

After completion of the charging process, the growth substrate 18 is peeled, as shown in FIG. 3(g). An existing peeling technique is used in this process. As an example of existing peeling means, a peeling technique using radiation of laser light can be used. For example, if a transparent substrate of, for example, sapphire is used as a growth substrate for the blue light emitting elements 30 and a group III nitride semiconductor is crystal-grown as a light emitting element layer, damage to the crystal growth layer can be reduced by radiating laser light from the transparent substrate side under a fixed condition. Note that the growth substrate 18 can be peeled using a wet etching method, grinding, polishing, or the like as other means.

Since the resin 50 closely fixes the electrodes 20 and the blue light emitting elements 30 to the substrate 10, the electrodes 20 and the blue light emitting elements 30 can be prevented from being peeled together at the time of peeling of the growth substrate 18. After the peeling of the growth substrate 18, the light outgoing surfaces of the blue light emitting elements 30 and the upper surface of the resin 50 are exposed. After the peeling of the growth substrate 18, the light outgoing surfaces of the blue light emitting elements 30 and the upper surface of the resin 50 lie in substantially the same plane.

Radiation of laser light has an impact only on a portion of several nm to several tens of nm on the growth substrate 18 side in each blue light emitting element 30, and the impact is sufficiently small.

After the peeling of the growth substrate 18, smoothness of a surface including the light outgoing surfaces of the blue light emitting elements 30 after the peeling can be increased using chemical mechanical polishing (CMP) and/or wet etching. Residues after the peeling can be removed. The increase in the smoothness and the removal of residues after the peeling allow easier formation of the color conversion layer 40 that is a next process and allow increase in the light extraction efficiency for light emitted from the blue light emitting elements 30.

If the blue light emitting element 30 made of a GaN-based material and an InGaN-based material is used, when the growth substrate 18 is peeled in the peeling process, a light outgoing surface made of the GaN-based material is formed. Note that the light outgoing surface of the blue light emitting element 30 after the peeling of the growth substrate 18 is generally composed of Ga and N. Note that a case where the light outgoing surface of the blue light emitting element 30 is composed only of Ga and a case where the light outgoing surface of the blue light emitting element 30 is composed only of N re conceivable, depending on a manufacturing condition for the blue light emitting element 30 and a peeling condition. The present embodiment sets a surface made of a GaN-based material as the light outgoing surface of the blue light emitting element 30, which includes the case where the light outgoing surface is composed only of Ga and the case where the light outgoing surface is composed only of N.

(Process of Forming Color Conversion Layer 40)

After completion of the peeling process, the color conversion layer 40 can be formed by one process out of (22) to (24) shown below. Processes (22) to (24) below are examples of a process of forming the color conversion layer 40.

(22) A substance obtained by kneading a photosensitive curing resin (photoresist) with a fluorescent substance is applied to the light outgoing surfaces of the blue light emitting elements 30 and the upper surface of the resin 50. A resist containing a necessary phosphor is left by a common photolithography process, thereby forming a phosphor pattern.

(23) A photoresist pattern for liftoff is formed at a position where a phosphor pattern is not to be left, using a common photoprocess. After application of resin containing a phosphor onto the photoresist pattern, the photoresist pattern is lifted off, thereby forming a resin pattern (the color conversion layer 40) containing the phosphor. The application of the resin containing the phosphor may be performed through spraying.

(24) An ink containing a phosphor is directly formed using a common printing technique. At this time, a coloring matter can be included in the ink together with the phosphor.

(Process of Forming Fixing Resin 60)

The color conversion layer 40 (a plate-like color conversion layer) having a surface with the same area as that of the light outgoing surface of the blue light emitting element 30 is created, and the color conversion layer 40 is arranged on the blue light emitting element 30. By covering the side surfaces and the upper surfaces of the color conversion layers 40 and the upper surface of the resin 50 with resin (resin in liquid form before the fixing resin 60 is solidified), the color conversion layers 40 are fixed to the blue light emitting elements 30 and the resin 50. After completion of the process of forming the fixing resin 60, manufacture of the light source device 1 is completed. The process of forming the fixing resin 60 described here is an example.

As described above, the growth substrate 18 (sapphire substrate) is peeled in the manufacture of the light source device 1. Accordingly, the light source device 1 thinner than a light source device including the growth substrate 18 by the thickness (about 100 μm in normal cases) of the growth substrate 18 can be manufactured. This brings the color conversion layer 40 into direct contact with the light outgoing surface of the blue light emitting element 30 in the light source device 1. That is, a whole surface of the color conversion layer 40 in contact with the blue light emitting element 30 is in direct contact with the light outgoing surface of the blue light emitting element 30.

No growth substrate 18 is present between the color conversion layer 40 and the blue light emitting element 30, and the color conversion layer 40 is in direct contact with the light outgoing surface of the blue light emitting element 30. This shortens a path for dissipating heat from each color conversion layer and allows increase in heat dissipation. Since scattering of light by the growth substrate 18 can be reduced, the light extraction efficiency and light emission uniformity can be increased. It is thus possible to output high-luminance light from the color conversion layer 40. Additionally, the removal of the growth substrate 18 reduces the overall size of the light source device 1.

In an aspect of the present invention, the substrate-side electrode 201 for the blue light emitting element 30 has an anode and a cathode formed at the same surface, and the anode and the cathode are present on a surface on the substrate 10 side of the substrate-side electrode 201. Additionally, only one or a plurality of elements out of the elements In, Ga, and N that are constituent elements of the blue light emitting element 30 are present on a surface on a side opposite to the substrate 10 side of the blue light emitting element 30.

In an aspect of the present invention, light emitted from the blue light emitting element 30 is extracted from the surface on the side opposite to the substrate 10 side of the blue light emitting element 30, and no electrode is present on the light outgoing surface of the blue light emitting element 30. For this reason, light emitted from the blue light emitting element 30 is not reflected by the light outgoing surface of the blue light emitting element 30, and the light extraction efficiency can be enhanced.

The color conversion layer 40 and the light outgoing surface of the blue light emitting element 30, that is, a surface without a metal film, such as an electrode, are in direct contact. For this reason, reflection by a metal film, such as an electrode, has an extremely small impact on light emitted from the blue light emitting element 30, and the light comes incident efficiently on the color conversion layer 40.

The direct formation of the color conversion layer 40 on the blue light emitting element 30 allows reduction in a difference in refractive index between the blue light emitting element 30 and the color conversion layer 40 at a boundary between the blue light emitting element 30 and the color conversion layer 40.

If a region composed of air or partially composed of another material or a layer composed of the other material is present between the blue light emitting element 30 and the color conversion layer 40, reflection and scattering and the like of light from the blue light emitting element 30 may occur. The other material is a material different from those for the blue light emitting element 30 and the color conversion layer 40. Even in the above-described case, an aspect of the present invention does not cause reflection and scattering and the like of light, and the light extraction efficiency can be enhanced.

Note that, even in the above-described case, the light extraction efficiency may be enhanced by forming an interface having an appropriate interface shape or an appropriate refractive index at a boundary between another component and the blue light emitting element 30 or the color conversion layer 40. The other component is a region composed of air or partially composed of another material or a layer composed of the other material.

Meanwhile, for example, if the color conversion layer 40 is formed on the blue light emitting element 30 via adhesive or the like, substances having different refractive indices come into contact with each other at each of a boundary between the color conversion layer 40 and a layer of the adhesive and a boundary between the blue light emitting element 30 and the layer of the adhesive. For this reason, light emitted from the blue light emitting element 30 may be refracted or reflected at the boundaries to reduce the efficiency of incidence of light on the color conversion layer 40.

If the blue light emitting element 30 has an upper and lower electrode structure having electrodes both at one surface of the blue light emitting element 30 and at a surface facing the surface, an electrode, that is, a metal film is present on the light outgoing surface side of the blue light emitting element 30. This prevents light emitted from the blue light emitting element 30 from entering the color conversion layer 40.

Effects of the direct formation of the color conversion layer 40 on the blue light emitting element 30 have been described here. In addition to the effects, the direct formation of the color conversion layer 40 on the blue light emitting element 30 may increase heat dissipation and improve mechanical properties.

The above-described manufacturing method is just an example of a method capable of manufacturing the light source device 1. The processes described here are intended to facilitate manufacture of the light source device 1, and processes constituting a method for manufacturing the light source device 1 are not limited to those.

According to an aspect of the present invention, the resin 50 is formed between the blue light emitting element 30 and the substrate 10. The resin 50 covers the substrate-side electrode 201 except the surface on the substrate 10 side and the surface on the light emitting element-side electrode 202 side. The resin 50 also covers the light emitting element-side electrode 202 except a surface on the blue light emitting element 30 side and a surface on the substrate-side electrode 201 side. Since the resin 50 increases adhesive strength between the blue light emitting element 30 and the substrate 10, the blue light emitting element 30 and the substrate 10 are unlikely to be peeled from each other, and the blue light emitting element 30 is stably held at the substrate 10.

For example, consider a case where the blue light emitting element 30 is subjected to external force in a process of peeling the growth substrate 18 and a process of forming the color conversion layer 40. In this case, the substrate-side electrode 201 and the light emitting element-side electrode 202 may be peeled from each other to disable the blue light emitting element 30 to be electrically driven and to emit light. On the other hand, since the resin 50 is present between the blue light emitting element 30 and the substrate 10, the possibility that the blue light emitting element 30 and the substrate 10 are peeled from each other is low even when the blue light emitting element 30 is subjected to external force. This stably maintains a state in which the blue light emitting element 30 adheres to the substrate 10.

The color conversion layer 40 may be a single layer or a combination of a plurality of color conversion layers different in absorptance or emission spectrum from each other. If the color conversion layer 40 is a single layer, the color conversion layer 40 is designed as a single layer, and a fabrication process thereof can be simplified.

Formation of the color conversion layer 40 by laying a plurality of layers on top of each other makes it possible to implement, with a higher degree of flexibility, properties of the color conversion layer 40 which suit a usage situation for each light emitting device using an aspect of the present invention. For example, if a light emitting device is used outdoors, the luminance of the light emitting device is more important, and an emission spectrum with high luminosity is important. Meanwhile, if the main purpose is to watch a video, such as a film, vividness of color is important, and a light emitting device obtained by combining a plurality of color conversion layers different in absorptance or emission spectrum from each other is preferable. In this case, an emission spectrum which allows increase in color reproduction range can be implemented. Additionally, consider a case where it is desired to achieve a purer emission color by completely color-convert blue light emitted from the blue light emitting element 30. In this case, a light conversion layer is preferably formed as a plurality of layers composed of a layer having mainly a color conversion function, a layer having a function of absorbing blue light left without being color-converted, and the like. As described above, the color conversion layer 40 may be constructed from a plurality of layers so as to suit a particular purpose or simultaneously suit a plurality of purposes.

(First Modification)

Figure 4:
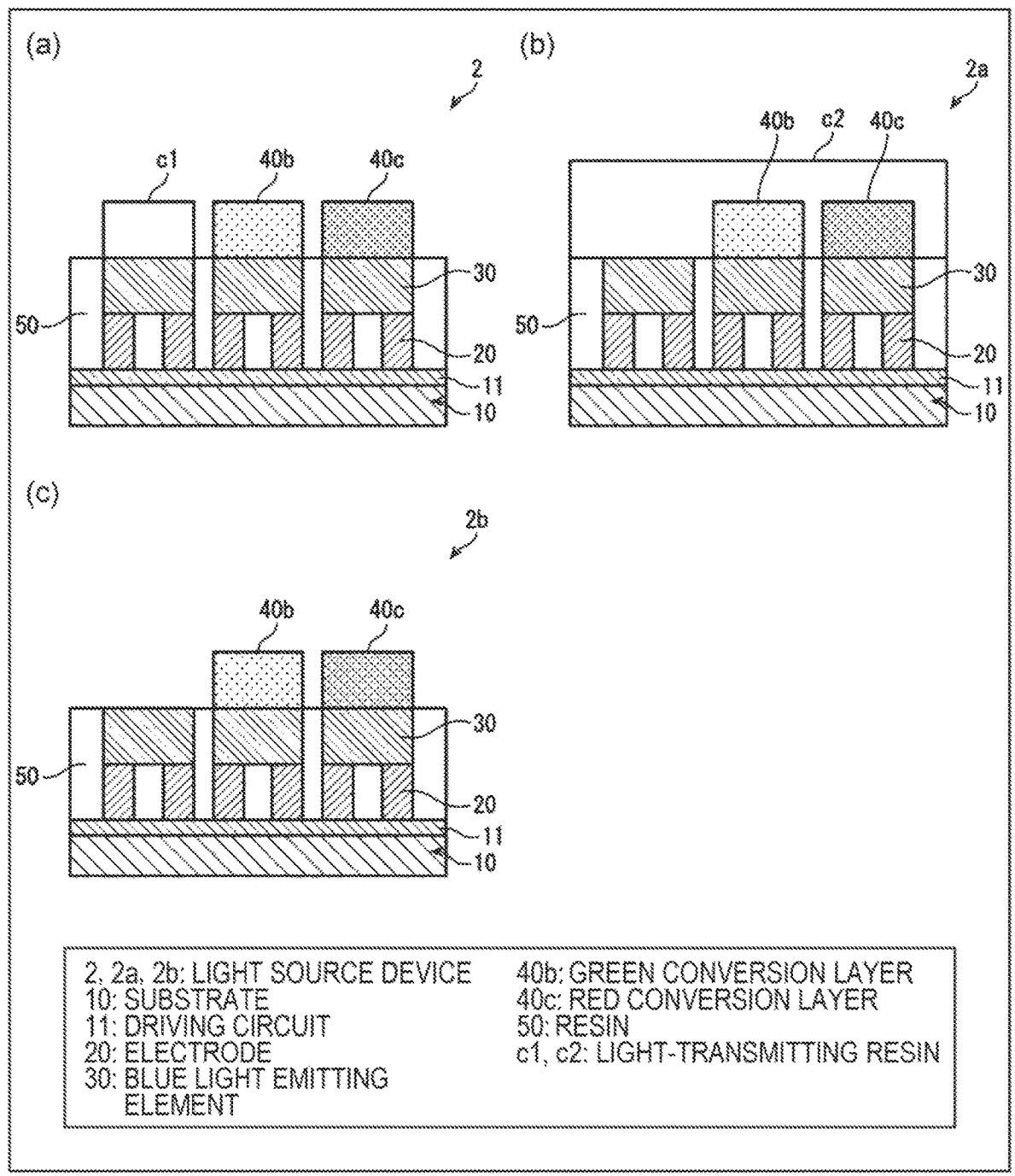
FIG. 4 illustrates cross-sectional views of light source devices which are first modifications of the light source devices shown in FIG. 2.
Figure 5:
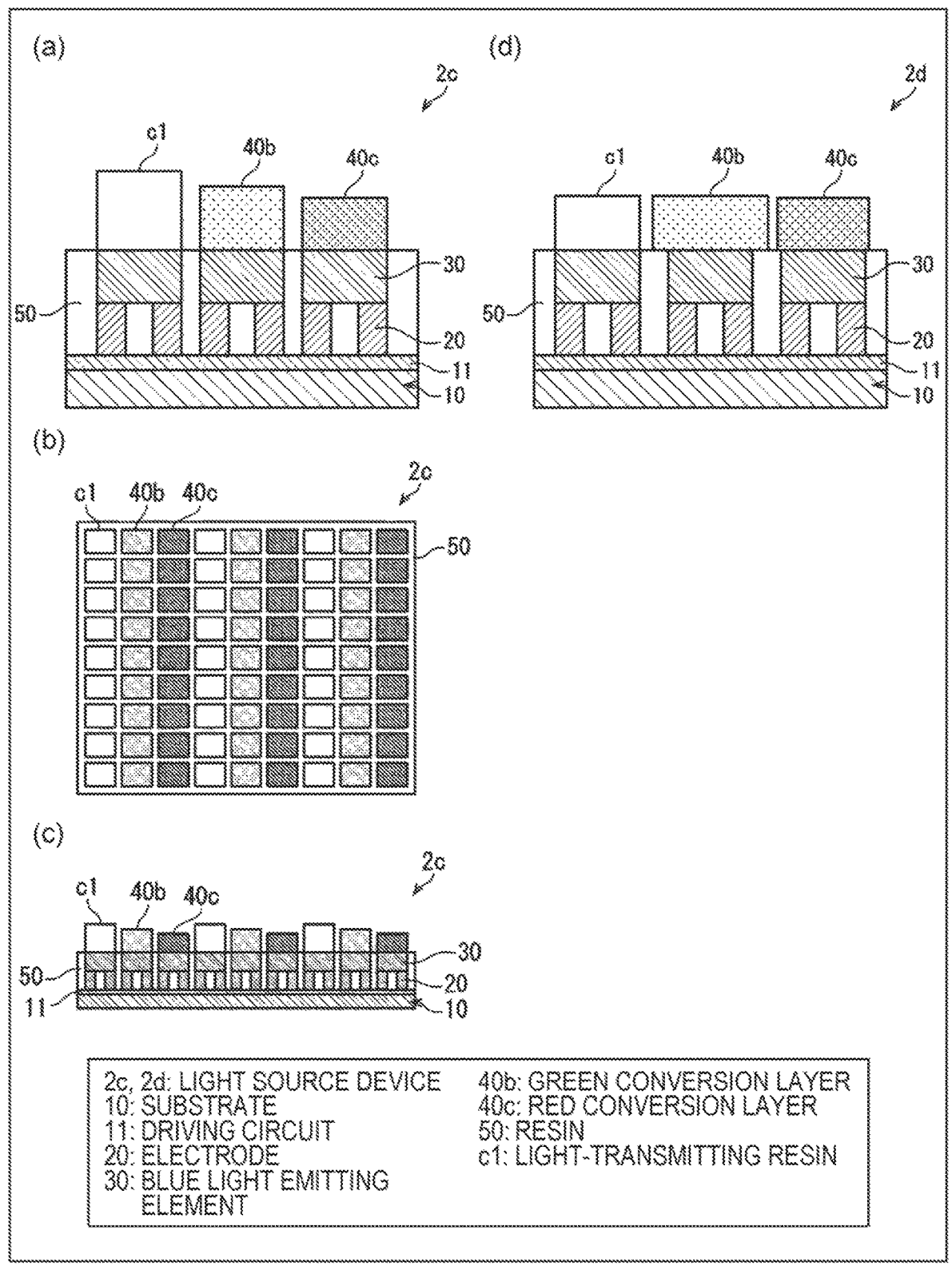
FIG. 5 illustrates views showing, in cross-section and top view, light source devices which are first modifications of the light source devices shown in FIG. 2.

Light source devices 2 to 2d which are first modifications of the light source device 1 will be described with reference to FIGS. 4 and 5. FIG. 4 illustrates cross-sectional views of the light source devices 2 to 2b that are first modifications of the light source device 1. FIG. 5 illustrates views showing, in cross-section and top view, the light source devices 2c and 2d that are first modifications of the light source device 1.

The light source device 2 is different from the light source device 1a in that the three color conversion layers 40 have been replaced with a light-transmitting resin c1, the green conversion layer 40b, and the red conversion layer 40c, respectively, as shown in FIG. 4(a). In the light source device 2 shown in FIG. 4(a), for example, the green conversion layer 40b contains $(Ba,Sr)_2SiO_4:Eu^{2+}$ as a green phosphor, and the red conversion layer 40c contains $Ca_2SiO_4:Eu^{2+}$ as a red phosphor. In the light source device 2, the light-transmitting resin c1 is arranged on a light outgoing surface of the blue light emitting element 30 that is a portion which emits blue light in the light source device 2. The phosphor concentration of the green conversion layer 40b is higher than that of the red conversion layer 40c. This is because a smaller Stokes shift is often more disadvantageous to light absorption, and a color conversion layer whose color is closer to blue preferably has a higher phosphor concentration. As described above, in a light source device according to an aspect of the present invention, the light-transmitting resin c1 may be formed on at least one of the plurality of blue light emitting elements 30. For this reason, even if a color conversion layer need not be arranged on the blue light emitting element 30, it is possible to prevent dust or the like from being deposited on the blue light emitting element 30.

The light-transmitting resin c1 is arranged on the light outgoing surface of one of three blue light emitting elements 30, and transmits light from the blue light emitting element 30 arranged immediately underneath the light-transmitting resin c1 and outputs the light. The light-transmitting resin c1 is preferably, for example, epoxy resin, silicon resin, acrylic resin, or the like. Impartment of photosensitivity to the light-transmitting resin c1 allows formation of the light-transmitting resin c1 using a photoprocess.

The light source device 2a is different from the light source device 1c in that the light source device 2a includes a light-transmitting resin c2, that no color conversion layer is provided on the light outgoing surface of one of three blue light emitting elements 30, and that the violet light emitting element 30a has been replaced with the blue light emitting element 30, as shown in FIG. 4(b). In the light source device 2a shown in FIG. 4(b), for example, the green conversion layer 40b contains $(Ba,Sr)_2SiO_4:Eu^{2+}$ as a green phosphor and the red conversion layer 40c contains $Ca_2SiO_4:E^{2+}$ as a red phosphor. Since the respective blue light emitting elements 30 are arranged immediately underneath two color conversion layers in the light source device 2a, a color conversion layer of blue out of color conversion layers of three colors of blue, green, and red is unnecessary.

The light-transmitting resin c2 fixes the green conversion layer 40b and the red conversion layer 40c to the blue light emitting elements 30 and the resin 50. The light-transmitting resin c2 covers side surfaces and an upper surface of the green conversion layer 40b and side surfaces and an upper surface of the red conversion layer 40c. The light-transmitting resin c2 also covers an upper surface of the resin 50. With this configuration, the light outgoing surfaces of the blue light emitting elements 30 and the upper surfaces of the green conversion layer 40b, the red conversion layer 40c, and the resin 50 can be protected with the light-transmitting resin c2. The light-transmitting resin c2 transmits light from the green conversion layer 40b, light from the red conversion layer 40c, and light from the blue light emitting element 30 arranged immediately underneath the light-transmitting resin c2 and outputs the light rays. The light-transmitting resin c2 is preferably, for example, epoxy resin, silicon resin, or acrylic resin. It is also possible to knead the light-transmitting resin c2 with a filler of alumina, silica, and/or titania or change the surface shape of the light-transmitting resin c2. This allows control of the light distribution characteristics of the light-transmitting resin c2 and increase in the light extraction efficiency of the light-transmitting resin c2.

The light source device 2b is different from the light source device 1c in that no color conversion layer is provided on the light outgoing surface of one of three blue light emitting elements 30 and that the violet light emitting element 30a has been replaced with the blue light emitting element 30, as shown in FIG. 4(c). In the light source device 2b shown in FIG. 4(c), for example, the green conversion layer 40b contains $(Ba,Sr)_2SiO_4:Eu^{2+}$ as a green phosphor, and the red conversion layer 40c contains $Ca_2SiO_4:Eu^{2+}$ as a red phosphor. Since the light source device 2b uses the blue light emitting element 30 as a light emitting element, a color conversion layer of blue out of color conversion layers of three colors of blue, green, and red is unnecessary. That is, the light outgoing surface of at least one of the plurality of blue light emitting elements 30 is exposed. For this reason, if a color conversion layer need not be arranged on the blue light emitting element 30, light emitted from the blue light emitting element 30 can be emitted directly to the outside. Also, a manufacturing process can be simplified.

As shown in FIGS. 5(a) to 5(c), the light source device 2c is obtained by changing the thicknesses of the light-transmitting resin c1, the green conversion layer 40b, and the red conversion layer 40c in the light source device 2. The thicknesses each refer to a thickness along a direction from the substrate 10 toward the blue light emitting element 30. For example, the thickness of the light-transmitting resin c1 may be larger than that of the green conversion layer 40b. Additionally, the thickness of the green conversion layer 40b may be larger than that of the red conversion layer 40c. As described above, the thicknesses of color conversion layers may differ depending on the type of the color conversion layer. This allows emission of light of a necessary color for each pixel.

The light source device 2d is obtained by changing the widths of the light-transmitting resin c1, the green conversion layer 40b, and the red conversion layer 40c in the light source device 2, as shown in FIG. 5(d). The widths each refer to a width along a direction orthogonal to the direction from the substrate 10 toward the blue light emitting element 30. For example, the width of the green conversion layer 40b may be larger than that of the red conversion layer 40c. The width of the red conversion layer 40c may be larger than that of the light-transmitting resin c1. As described above, the widths of color conversion layers may differ depending on the type of the color conversion layer. For example, consider a case using the blue light emitting element 30. In this case, the light-transmitting resin c1 is applied onto the blue light emitting element 30 in charge of blue light. Since blue light is extracted from the blue light emitting element 30, color conversion by a color conversion layer is unnecessary. That is, the small width of the light-transmitting resin c1 corresponding to a color conversion layer does not cause a major problem. Meanwhile, the green conversion layer 40b containing a green phosphor is applied onto the blue light emitting element 30 in charge of green light. The green conversion layer 40b is required to inhibit reduction in color reproduction range due to lack of blue light. For this reason, the green conversion layer 40b is more advantageous if the green conversion layer 40b has a larger width.

As described earlier, the thickness of the color conversion layer 40 may be different for each of the color conversion layers 40 formed on the respective blue light emitting elements 30. The absorption intensity of blue light in a green phosphor is generally lower than that of blue light in a red phosphor. For this reason, the thickness of a color conversion layer containing a green phosphor is preferably larger than that of a color conversion layer containing a red phosphor.

If there is variation in luminance or variation in emission wavelength among the blue light emitting elements 30, the thickness of the color conversion layer 40 formed on each blue light emitting element 30 is changed in accordance with a variation. This allows implementation of output of light without variation in luminance and chromaticity in a state where the color conversion layers 40 are formed on the blue light emitting elements 30.

To form the color conversion layers 40 using a photo process, a light emitting device is preferably designed such that the thicknesses of the color conversion layers 40 differ depending on the color of the color conversion layer 40.

For example, consider a case where the green conversion layer 40b and the red conversion layer 40c are formed. In this case, after a photoresist containing a red phosphor is applied onto the blue light emitting elements 30 through spin-coating or with a squeegee, light radiation for photoresist curing is performed only on the blue light emitting element 30 that is to be caused to emit red light, using a photomask or the like. In this manner, the red conversion layer 40c is formed.

A photoresist containing a green phosphor is then applied onto the blue light emitting elements 30 through spin-coating or with a squeegee. At this time, the thickness of the photoresist containing the green phosphor is set larger than that of the red conversion layer 40c. This makes it possible to apply the photoresist containing the preen phosphor such that the thickness of the photoresist containing the green phosphor is larger than that of the red conversion layer 40c and such that the thickness of the photoresist containing the green phosphor is uniform. On the other hand, when the red conversion layer 40c is to be formed after the formation of the green conversion layer 40b, the thickness of the photoresist containing the red phosphor needs to be smaller than that of the green conversion layer 40b, and uniform application of the red conversion layer 40c is difficult. After that, light radiation for photoresist curing is performed only on the blue light emitting element 30 that is to be caused to emit green light, using a photomask or the like. In this manner, the preen conversion layer 40b is formed.

(Second Modification)

Figure 6:
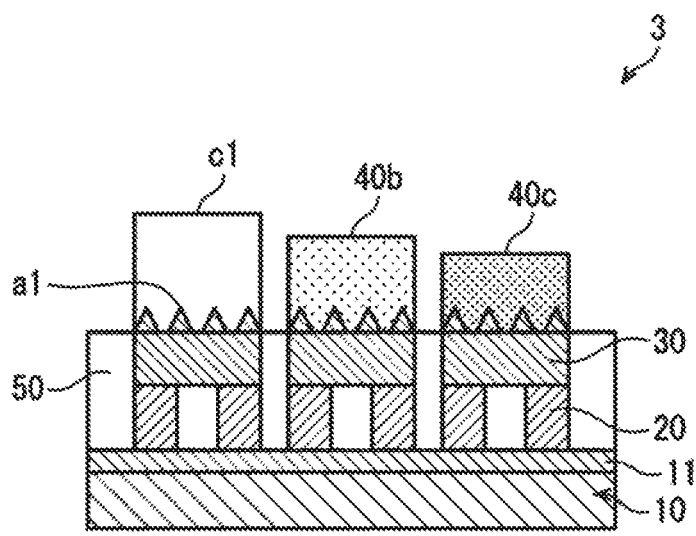
FIG. 6 is a cross-sectional view of a light source device which is a second modification of the light source device shown in FIG. 2.

A light source device 3 which is a second modification of the light source device 1 will be described with reference to FIG. 6. FIG. 6 is a cross-sectional view of the light source device 3 that is a second modification of the light source device 1. The light source device 3 is different from the light source device 2c in that a light outgoing surface of the blue light emitting element 30 is an uneven surface a1, as shown in FIG. 6.

The uneven surface a1 is a surface in which the spacing between projection-recess pairs is fixed and is a portion with a patterned sapphire substrate (PSS) left. That is, the light outgoing surface of the blue light emitting element 30 has a PSS (recesses with a spacing of about 2 μm and a depth of about 1 μm). A PSS can be scraped off by surface polishing or etching or the blue light emitting element 30 can be formed using the growth substrate 18 with no PSS. It is also possible to form projections and recesses on the light outgoing surface side of the blue light emitting element 30 by, for example, wet etching and/or dry etching after forming the blue light emitting element 30 using the growth substrate 18 with no PSS. As described above, projections and recesses are formed at the light outgoing surface of the blue light emitting element 30. This allows efficient emission of light from the blue light emitting element 30 and increase in light extraction efficiency. Since the projections and recesses increase an area of adhesion between the blue light emitting element 30 and each color conversion layer (or a light-transmitting resin c1), adhesive strength can be increased. Each projection-recess pair preferably has a shape recessed from a top of the light outgoing surface, and each recess more preferably has the shape of a cone. An apex of the cone preferably has an angle of 30° to 120°, more preferably 50° to 110°, still more preferably 70° to 100°. Since the projections and recesses increase the area of adhesion between the blue light emitting element 30 and each color conversion layer (or the light-transmitting resin c1), the adhesive strength between the blue light emitting element 30 and each color conversion layer (or the light-transmitting resin c1) can be increased.

Second Embodiment

Figure 7:
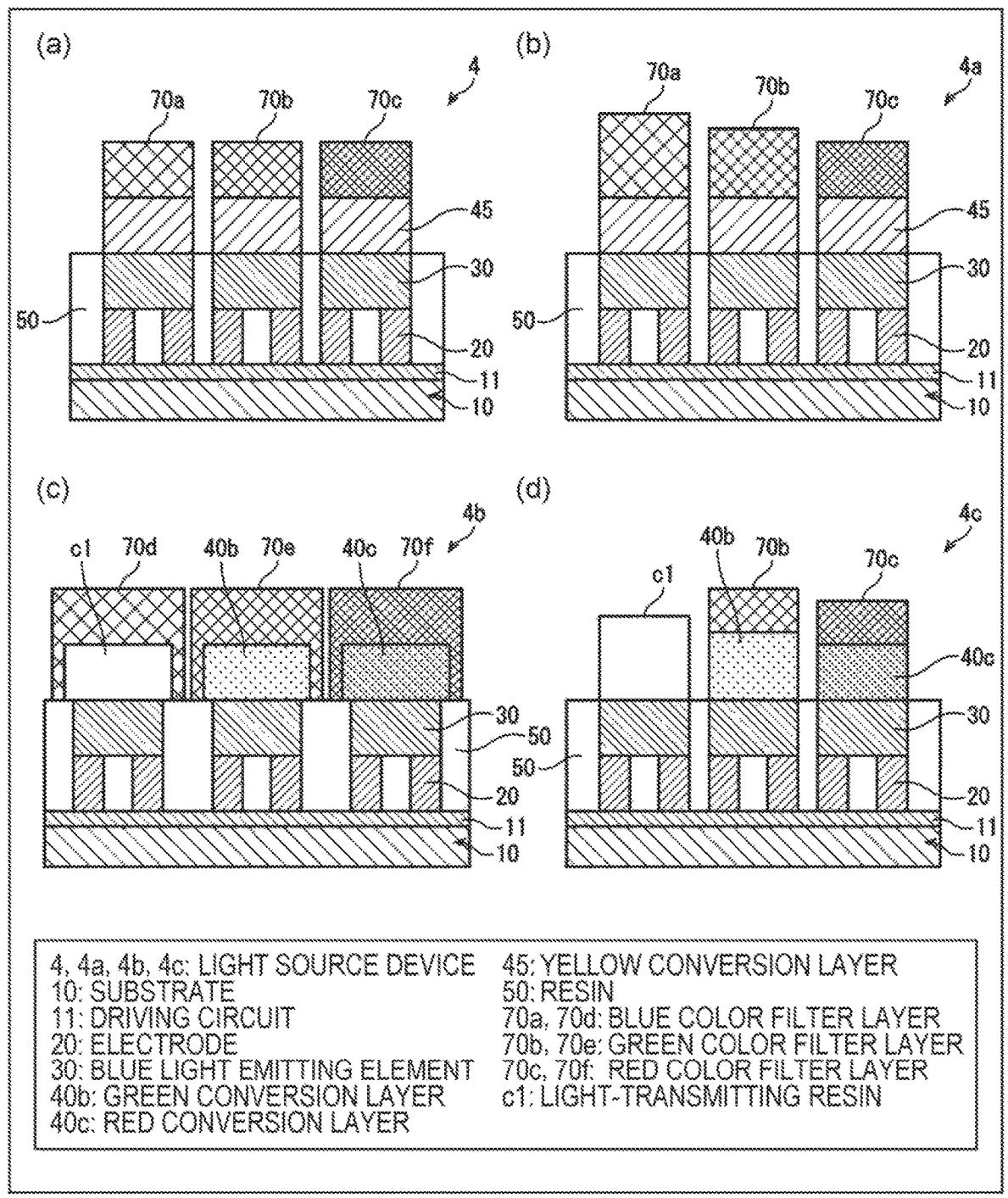
FIG. 7 illustrates cross-sectional views of light source devices according to a second embodiment of the present invention.

Another embodiment of the present invention will be described with reference to FIG. 7 as follows. Note that, for convenience of description, members having the same functions as those described in the above-described embodiment are denoted by the same reference characters and that a description thereof will be omitted. FIG. 7 illustrates cross-sectional views of light source devices 4 to 4c according to a second embodiment of the present invention.

The light source device 4 is different from the light source device 1 in inclusion of a blue color filter layer 70a, a green color filter layer 70b, and a red color filter layer 70c, as shown in FIG. 7(a). The light source device 4 is also different from the light source device 1 in that the color conversion layer 40 has been replaced with a yellow conversion layer 45 (phosphor layer). The yellow conversion layer 45 contains a yellow phosphor, such as $Y_3A_{15}O_{12}$:$Ce^{3+}$. The yellow conversion layer 45 may be one which converts light emitted from a blue light emitting element 30 into yellow light by including a plurality of different types of phosphors, such as a green phosphor and a red phosphor, in the yellow conversion layer 45.

The blue color filter layer 70a is in contact with an upper surface of the yellow conversion layer 45, contains a light absorbing material, and transmits only blue light out of light output from the yellow conversion layer 45. More specifically, the blue color filter layer 70a is arranged on the yellow conversion layer 45, transmits only light of a particular wavelength out of light output from the yellow conversion layer 45 arranged immediately underneath the blue color filter layer 70a, and outputs blue light. The width of the blue color filter layer 70a is equal to the width of the yellow conversion layer 45 arranged immediately underneath the blue color filter layer 70a. The widths each refer to a width along a direction orthogonal to a direction from a substrate 10 toward the blue light emitting element 30.

The green color filter layer 70b is in contact with the upper surface of the yellow conversion layer 45, contains a light absorbing material, and transmits only green light out of light output from the yellow conversion layer 45. More specifically, the green color filter layer 70b is arranged on the yellow conversion layer 45, transmits only light of a particular wavelength out of light output from the yellow conversion layer 45 arranged immediately underneath the green color filter layer 70b, and emits the green light. The width of the green color filter layer 70b is equal to that of the yellow conversion layer 45 arranged immediately underneath the green color filter layer 70b.

The red color filter layer 70c is in contact with the upper surface of the yellow conversion layer 45, contains a light absorbing material, and transmits only red light out of light output from the yellow conversion layer 45. More specifically, the red color filter layer 70c is arranged on the yellow conversion layer 45, transmits only light of a particular wavelength out of light output from the yellow conversion layer 45 arranged immediately underneath the red color filter layer 70c, and outputs red light. The width of the red color filter layer 70c is equal to that of the yellow conversion layer 45 arranged immediately underneath the red color filter layer 70c.

As described above, a color filter layer is arranged on each yellow conversion layer 45 in the light source device 4. For this reason, light of a necessary color can be emitted by selecting a color filter layer type.

(Method for Forming Color Filter Layer)

A method for forming a color filter layer will be described here. A color filter layer can be formed by processing (4) to processing (8) below. Processing (4) to processing (8) below are an example of processing for implementing a configuration shown in FIG. 7(a).

(4) A red color filter resist is applied to the upper surface of the yellow conversion layer 45.

(5) Ultraviolet light is radiated, using a photomask, only to a portion on the blue light emitting element 30 of the red color filter resist to cure the red color filter resist.

(6) An uncured portion of the red color filter resist is removed.

(7) A green color filter resist is applied to the upper surface of the yellow conversion layer 45. Processing (5) and processing (6) performed on the red color filter resist are performed also on the green color filter resist.

(8) A blue color filter resist is applied to the upper surface of the yellow conversion layer 45. Processing (5) and processing (6) performed on the red color filter resist are performed also on the blue color filter resist.

The light source device 4a is different from the light source device 4 in difference in thickness among the blue color filter layer 70a, the green color filter layer 70b, and the red color filter layer 70c, as shown in FIG. 7(b). The thickness refers to a thickness along the direction from the substrate 10 toward the blue light emitting element 30. For example, the thickness of the blue color filter layer 70a may be larger than that of the green color filter layer 70b. The thickness of the green color filter layer 70b may be larger than that of the red color filter layer 70c. As described above, the thicknesses of color filter layers may differ depending on the type of the color filter layer. This allows emission of light of a necessary color for each pixel.

Note that, for the light source device 4a, that is, a configuration shown in FIG. 7(b), processing that applies a green color filter resist to a thickness larger than that of a red color filter resist is performed in processing (7) described earlier. Also, for the light source device 4a, that is, the configuration shown in FIG. 7(b), processing that applies a blue color filter resist to a thickness larger than that of the green color filter resist is performed in processing (8) described earlier. In the light source device 4a, processing is performed such that the color filter layers are formed in ascending order of thickness. The above-described types of processing are examples.

The light source device 4b is different from the light source device 4 in the two respects below, as shown in FIG. 7(c). The first one is that the blue color filter layer 70a, the green color filter layer 70b, and the red color filter layer 70c have been replaced with a blue color filter layer 70d, a green color filter layer 70e, and a red color filter layer 70f, respectively. The second one is that the three yellow conversion layers 45 have been replaced with a light-transmitting resin c1, a green conversion layer 40b, and a red conversion layer 40c, respectively. Note that the width of the light-transmitting resin c1 may be larger than that of the blue light emitting element 30 arranged immediately underneath the light-transmitting resin c1 and that the width of the green conversion layer 40b may be larger than that of the blue light emitting element 30 arranged immediately underneath the green conversion layer 40b. The width of the red conversion layer 40c may be larger than that of the blue light emitting element 30 arranged immediately underneath the red conversion layer 40c. This allows reduction in a situation where light emitted from the blue light emitting element 30 does not pass through a color conversion layer. The widths each refer to a width along the direction orthogonal to the direction from the substrate 10 toward the blue light emitting element 30.

The blue color filter layer 70d is in contact with an upper surface of the light-transmitting resin c1, contains a light absorbing material, and transmits only blue light out of light output from the light-transmitting resin c1. More specifically, the blue color filter layer 70d transmits only light of a particular wavelength out of light output from the light-transmitting resin c1 arranged in the blue color filter layer 70d, and outputs blue light. The width of the blue color filter layer 70d is larger than that of the light-transmitting resin c1 arranged in the blue color filter layer 70d. Note that the blue color filter layer 70d may cover the light-transmitting resin c1.

The green color filter layer 70e is in contact with an upper surface of the green conversion layer 40b, contains a light absorbing material, and transmits only green light out of light output from the green conversion layer 40b. More specifically, the green color filter layer 70e transmits only light of a particular wavelength out of light output from the green conversion layer 40b arranged in the green color filter layer 70e, and outputs green light. The width of the green color filter layer 70e is larger than that of the green conversion layer 40b arranged in the green color filter layer 70e. Note that the green color filter layer 70e may cover the green conversion layer 40b.

The red color filter layer 70f is in contact with an upper surface of the red conversion layer 40c, contains a light absorbing material, and transmits only red light out of light output from the red conversion layer 40c. More specifically, the red color filter layer 70f transmits only light of a particular wavelength out of light output from the red conversion layer 40c arranged in the red color filter layer 70f, and outputs red light. The width of the red color filter layer 70f is larger than that of the red conversion layer 40c arranged in the red color filter layer 70f. Note that the red color filter layer 70f may cover the red conversion layer 40c.

As described above, the width of a color filter layer may be larger than that of a color conversion layer. This allows reduction in a situation where light output from a color conversion layer does not pass through a color filter layer. Kneading of each color filter layer with a filler of alumina, silica, and/or titania or changing of the surface shape of the color filter layer allows control of the light distribution characteristics of the color filter layer and increase in light extraction efficiency.

The light source device 4c is different from the light source device 4 in the three respects below, as shown in FIG. 7(d). The first one is that no color filter layer is provided on the upper surface of the light-transmitting resin c1. The second one is that the three yellow conversion layers 45 have been replaced with the light-transmitting resin c1, the green conversion layer 40b, and the red conversion layer 40c. The third one is that the light-transmitting resin c1, the green conversion layer 40b, and the red conversion layer 40c are different in thickness.

The light source device 4c uses the blue light emitting element 30 as a light emitting element, and the light-transmitting resin c1 is arranged on a light outgoing surface of the blue light emitting element 30. For this reason, a color filter layer of blue out of color filter layers of three colors of blue, green, and red is unnecessary.

In the second embodiment, a violet light emitting element 30a may be used instead of the blue light emitting element 30. In a case using the violet light emitting element 30a, each color conversion layer may be constructed by combining more phosphors, such as simultaneously including two blue and yellow phosphors in the color conversion layer or simultaneously including three blue, green, and red phosphors in the color conversion layer.

Third Embodiment

Figure 8:
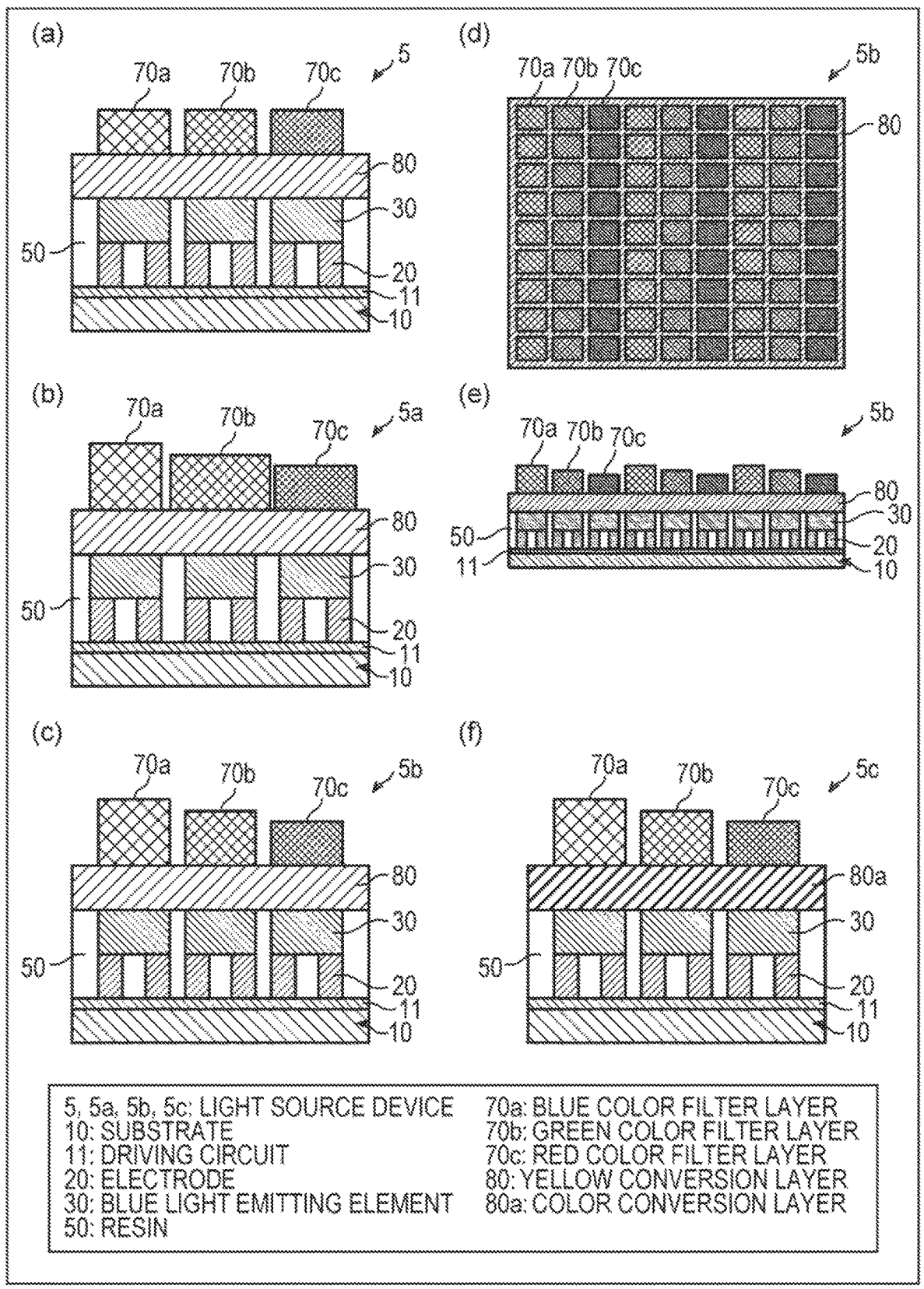
FIG. 8 illustrates views showing, in cross-section and top view, light source devices according to a third embodiment of the present invention.

Another embodiment of the present invention will be described with reference to FIG. 8 as follows. Note that, for convenience of description, members having the same functions as those described in the above-described embodiments are denoted by the same reference characters and that a description thereof will be omitted. FIG. 8 illustrates views showing, in cross-section and top view, light source devices 5 to 5c according to a third embodiment of the present invention.

The light source device 5 is different from the light source device 4 in that the yellow conversion layer 45 has been replaced with a yellow conversion layer 80 (phosphor layer), as shown in FIG. 8(a). One yellow conversion layer 80 is arranged on a light outgoing surface of a blue light emitting element 30 and an upper surface of a resin 50. That is, the one yellow conversion layer 80 is in contact with the light outgoing surfaces of three blue light emitting elements 30. Note that the light outgoing surfaces of the three blue light emitting elements 30 and the upper surface of the resin 50 lie in substantially the same plane.

The yellow conversion layer 80 converts the wavelength of light emitted from the light outgoing surfaces of the three blue light emitting elements 30. A resin used in the yellow conversion layer 80 is the same material as one used in the yellow conversion layer 45. A phosphor contained in the yellow conversion layer 80 is formed of the same material as a phosphor contained in the yellow conversion layer 45. A blue color filter layer 70a, a green color filter layer 70b, and a red color filter layer 70c are arranged on an upper surface of the one yellow conversion layer 80.

The blue color filter layer 70a, the green color filter layer 70b, and the red color filter layer 70c correspond one-to-one with the three blue light emitting elements 30, respectively. When the light source device 5 is viewed from the light outgoing surface side of the blue light emitting element 30, a lower surface of the blue color filter layer 70a coincides with the light outgoing surface of the corresponding blue light emitting element 30, and a lower surface of the green color filter layer 70b coincides with the light outgoing surface of the corresponding blue light emitting element 30. When the light source device 5 is viewed from the light outgoing surface side of the blue light emitting element 30, a lower surface of the red color filter layer 70c coincides with the light outgoing surface of the corresponding blue light emitting element 30.

As described above, since the yellow conversion layer 80 is to be brought into contact with the light outgoing surfaces of the plurality of blue light emitting elements 30 in the light source device 5, formation of the yellow conversion layer 80 is easy. Additionally, since the yellow conversion layer 80 can be formed at one time, uniform light can be obtained.

The light source device 5a is obtained by changing the thicknesses and the widths of the blue color filter layer 70a, the green color filter layer 70b, and the red color filter layer 70c in the light source device 5, as shown in FIG. 8(b). The thicknesses each refer to a thickness along a direction from a substrate 10 toward the blue light emitting element 30, and the widths each refer to a width along a direction orthogonal to the direction from the substrate 10 toward the blue light emitting element 30.

The thickness of the blue color filter layer 70a may be, for example, larger than that of the green color filter layer 70b. The thickness of the green color filter layer 70b may be larger than that of the red color filter layer 70c.

Additionally, the width of the green color filter layer 70b may be, for example, larger than that of the red color filter layer 70c. The width of the red color filter layer 70c may be larger than that of the blue color filter layer 70a.

As described above, the thicknesses and the widths of color filter layers may differ depending on the type of the color filter layer. This allows emission of light of a necessary color for each pixel. Note that although the color filter layers are different in thickness and width here, the color filter layers may be different only in width.

The light source device 5b is obtained by changing the thicknesses of the blue color filter layer 70a, the green color filter layer 70b, and the red color filter layer 70c in the light source device 5, as shown in FIGS. 8(c) to 8(e). The thicknesses each refer to a thickness along the direction from the substrate 10 toward the blue light emitting element 30.

For example, the thickness of the blue color filter layer 70a may be larger than that of the green color filter layer 70b. The thickness of the green color filter layer 70b may be larger than that of the red color filter layer 70c. As described above, the thicknesses of color filter layers may differ depending on the type of the color filter layer. This allows emission of light of a necessary color for each pixel.

The light source device 5c is different from the light source device 5b in that the yellow conversion layer 80 has been replaced with a color conversion layer 80a, as shown in FIG. 8(f). The color conversion layer 80a has the same shape as the yellow conversion layer 80. The color conversion layer 80a contains a red phosphor and a green phosphor. As described above, a plurality of types of phosphors may be included in each color conversion layer. This allows finer control of an optical spectrum output from a pixel.

A violet light emitting element 30a may be used instead of the blue light emitting element 30 in the third embodiment. In a case using the violet light emitting element 30a, each color conversion layer may be constructed by combining more phosphors, such as simultaneously including two blue and yellow phosphors in the color conversion layer or simultaneously including three blue, green, and red phosphors in the color conversion layer.

Fourth Embodiment

Figure 9:
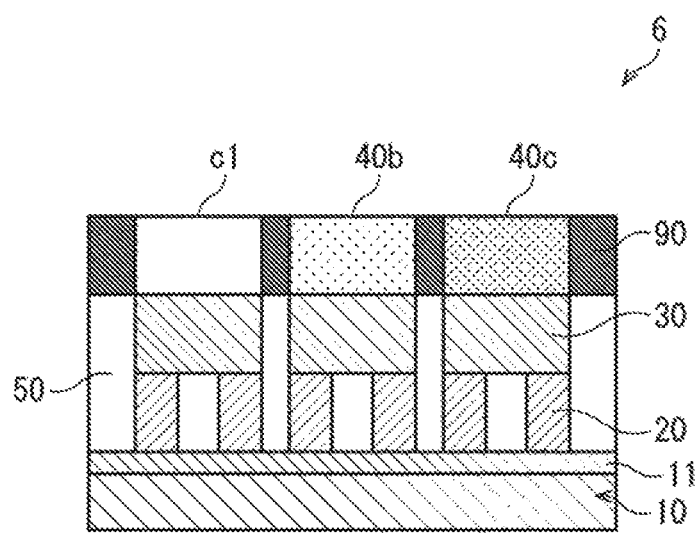
FIG. 9 is a cross-sectional view of a light source device according to a fourth embodiment of the present invention.

Another embodiment of the present invention will be described with reference to FIG. 9 as follows. Note that, for convenience of description, members having the same functions as those described in the above-described embodiments are denoted by the same reference characters and that a description thereof will be omitted. FIG. 9 is a cross-sectional view of a light source device 6 according to a fourth embodiment of the present invention.

The light source device 6 is different from the light source device 2 in inclusion of a light absorbing layer 90, as shown in FIG. 9. The light absorbing layer 90 is arranged between a light-transmitting resin c1, a green conversion layer 40b, and a red conversion layer 40c. The light absorbing layer 90 is made of a resin, such as a white resin. The thickness of the light absorbing layer 90 is preferably about half to about twice that of each color conversion layer, and the optical absorptance of the light absorbing layer 90 is preferably not less than 50%. An upper surface of the light absorbing layer 90 lies in substantially the same plane as upper surfaces of the light-transmitting resin c1, the green conversion layer 40b, and the red conversion layer 40c. That is, the thickness of the light absorbing layer 90 is equal to those of the light-transmitting resin c1, the green conversion layer 40b, and the red conversion layer 40c. The thicknesses each refer to a thickness along a direction from a substrate 10 toward a blue light emitting element 30.

The light source device 6 may include a light reflecting layer instead of the light absorbing layer 90. The light reflecting layer is arranged between the light-transmitting resin c1, the green conversion layer 40b, and the red conversion layer 40c. The light reflecting layer is made of a resin, such as a white resin. The thickness of the light reflecting layer is preferably about half to not more than about twice that of each color conversion layer, and the optical reflectance of the light reflection layer is preferably not less than 50%. An upper surface of the light reflecting layer lies in substantially the same plane as the upper surfaces of the light-transmitting resin c1, the green conversion layer 40b, and the red conversion layer 40c. That is, the thickness of the light reflecting layer is equal to those of the light-transmitting resin c1, the green conversion layer 40b, and the red conversion layer 40c.

With the above-described configuration, light components heading from the light-transmitting resin c1 toward the green conversion layer 40b decrease, and light components heading from the green conversion layer 40b toward the light-transmitting resin c1 and the red conversion layer 40c decrease. Additionally, light components heading from the red conversion layer 40c toward the green conversion layer 40b decrease. This allows reduction in a situation where light output from the light-transmitting resin c1, light output from the green conversion layer 40b, and light output from the red conversion layer 40c are mixed.

(Method for Forming Light Absorbing Layer 90)

A method for forming the light absorbing layer 90 will be described here. The light absorbing layer 90 can be formed by processing (9) to processing (11) below. Processing (9) to processing (11) below are an example of processing that forms the light absorbing layer 90. Note that the light reflecting layer can also be formed by the same processing as processing (9) to processing (11) below.

(9) After joining the blue light emitting elements 30 to the substrate 10 via electrodes 20, an underfill material is applied so as to cover an upper surface of the substrate 10 and the blue light emitting elements 30.

(10) A portion on the blue light emitting elements 30 of the underfill material is removed. That is, a recess is formed to be surrounded by a wall of the underfill material.

(11) A color conversion layer is stuffed to fit in the recess.

[Concerning Light Emitting Element and Color Conversion Layer]

The shapes of a blue light emitting element, a violet light emitting element, a color conversion layer, and a color filter layer are not limited to the shape of a rectangular parallelepiped and may be the shapes of a circular column, a polygonal column, a truncated cone, a truncated polygonal pyramid, and a hemisphere. Blue and violet light emitting elements having different sizes may be included in one light source device. The ratio of a plurality of types of color conversion layers, that is, the ratio of blue, green, and red need not be 1:1:1, as shown in FIG. 2(f), and may be, for example, 1:2:1.

[Concerning Light Source Device]

In a light source device according to an aspect of the present invention, individual light emitting elements may be an array (structure) arranged in a pattern of an m×n (m and n are natural numbers) grid on a substrate, as described earlier. Alternatively, the individual light emitting elements may be arranged in a staggered pattern or any other pattern. The light source device is used in a light emitting device, such as a head-mounted display or a display for a glasses-type device. The light emitting device may be equipped with one array or a plurality of arrays. Turn-on/turn-off of light emitting elements of the light source device corresponding to pixels of a display screen of the light emitting device are individually controlled by the driving circuit 11, which allows increase in contrast.

[Conclusion]

A light source device (1) according to a first aspect of the present invention includes: a driving circuit (11); a light emitting element (the blue light emitting element 30) made of a group III nitride semiconductor which has a light outgoing surface on a side opposite to a side with the driving circuit, is arranged on the driving circuit, and is electrically connected to the driving circuit; and a color conversion layer (the color conversion layer 40) which is in contact with the light outgoing surface and converts a wavelength of light emitted from the light outgoing surface, and the light outgoing surface is made of a group III nitride semiconductor.

According to the above-described configuration, the direct contact between the color conversion layer and the light outgoing surface of the light emitting element allows increase in light extraction efficiency and light emission uniformity. The direct contact between the color conversion layer and the light outgoing surface of the light emitting element also reduces an overall size of the light source device. It is further possible to curb an impact of heat and color unevenness.

In a light source device (1) according to a second aspect of the present invention, in the first aspect, the light emitting element (the blue light emitting element 30) may include at least two light emitting elements, and the light outgoing surfaces of the plurality of light emitting elements may lie in substantially a same plane.

According to the above-described configuration, the light outgoing surfaces of the plurality of light emitting elements lie in substantially the same plane. This allows easy application of the color conversion layer to the light outgoing surface of the light emitting element.

In a light source device (1c) according to a third aspect of the present invention, in the second aspect, the color conversion layer (the blue conversion layer 40a, the green conversion layer 40b, and the red conversion layer 40c) may include at least two types of color conversion layers such that light after conversion has different wavelengths.

According to the above-described configuration, since the number of types of the color conversion layers is not less than two such that light after conversion has different wavelengths, various types of light can be emitted.

In a light source device (2) according to a fourth aspect of the present invention, in the second aspect, the light-transmitting resin (c1) may be formed on at least one of the light emitting elements (the blue light emitting elements 30).

According to the above-described configuration, the light-transmitting resin is formed an the at least one light emitting element. This makes it possible to prevent dust or the like from being deposited on each light emitting element in a case where the color conversion layer need not be arranged on the light emitting element.

In a light source device (2b) according to a fifth aspect of the present invention, in the second aspect, the light outgoing surface of at least one of the light emitting elements (the blue light emitting elements 30) may be exposed.

According to the above-described configuration, the light outgoing surface of the at least one of the plurality of light emitting elements is exposed. This makes it possible to emit light emitted from each light emitting element directly to the outside in a case where the color conversion layer need not be arranged on the light emitting element.

In a light source device (2c) according to a sixth aspect of the present invention, in the second aspect, a thickness of the color conversion layer (the green conversion layer 40b and the red conversion layer 40c) along a direction from the driving circuit (11) toward the light emitting element (the blue light emitting element 30) may be different for each of type of the color conversion layer.

According to the above-described configuration, the thickness of the color conversion layer along the direction from the driving circuit toward the light emitting element is different for each of the type of the color conversion layer. This allows, for example, emission of light of a necessary color for each pixel.

In a light source device (2d) according to a seventh aspect of the present invention, in the second aspect, a width of the color conversion layer (the green conversion layer 40b and the red conversion layer 40c) along a direction orthogonal to a direction from the driving circuit (11) toward the light emitting element (the blue light emitting element 30) may be different for each of type of the color conversion layer.

In a light source device (1c) according to an eighth aspect of the present invention, in the second aspect, a concentration of a color conversion material contained in the color conversion layer (the blue conversion layer 40a, the green conversion layer 40b, and the red conversion layer 40c) may be different for each of type of the color conversion layer.

According to the above-described configuration, the concentration of the color conversion material contained in the color conversion layer is different for each of the type of the color conversion layer. This makes it possible to, for example, set an appropriate color conversion material concentration for each color and emit optimum light.

In a light source device (3) according to a ninth aspect of the present invention, in the first aspect, projections and recesses may be formed at the light outgoing surface.

According to the above-described configuration, the projections and recesses are formed at the light outgoing surface of the light emitting element. This makes it possible to efficiently emit light from the light emitting element and increase light extraction efficiency.

A light source device (1a) according to a tenth aspect of the present invention, in the second aspect, may further include a light blocking layer which is arranged between the light emitting elements (the blue light emitting elements 30) adjacent to each other, and a surface of the light blocking layer on the side opposite to the side with the driving circuit (11) and the light outgoing surface may lie in substantially the same plane.

According to the above-described configuration, a probability that, when light from each of the light emitting elements excites the color conversion layer on the light emitting element to emit light, the light emitting element excites the color conversion layer located on the light emitting element adjacent to that light emitting element to emit light decreases. This allows obtainment of a sharp image. Strength with which the light emitting element is held increases, which allows extension of a life of the light source device. Additionally, since the light outgoing surface of the light emitting element and the surface of the light blocking layer on the side opposite to the side with the substrate lie in substantially the same plane, the color conversion layer can be easily formed.

A light source device (4) according to an eleventh aspect of the present invention includes: a driving circuit (11); a light emitting element (the blue light emitting element 30) made of a group III nitride semiconductor which has a light outgoing surface on a side opposite to a side with the driving circuit, is arranged on the driving circuit, and is electrically connected to the driving circuit; a phosphor layer (the yellow conversion layer 45) which is in contact with the light outgoing surface and converts a wavelength of light emitted from the light outgoing surface; and a color filter layer (the blue color filter layer 70a, the green color filter layer 70b, and the red color filter layer 70c) which is arranged on the phosphor layer, and the light outgoing surface is made of a group III nitride semiconductor.

According to the above-described configuration, the color filter layer is arranged on the phosphor layer. This makes it possible to emit light of a necessary color by selecting type of the color filter layer.

In a light source device (5) according to a twelfth aspect of the present invention, in the eleventh aspect, the light emitting element (the blue light emitting element 30) may include at least two light emitting elements, and the phosphor layer (the yellow conversion layer 80) may be in contact with the respective light outgoing surfaces of the light emitting elements.

According to the above-described configuration, the phosphor layer is in contact with the respective light outgoing surfaces of the plurality of light emitting elements. Since the phosphor layer is brought into contact with the respective light outgoing surfaces of the plurality of light emitting elements, formation of the color conversion layer is easy.

A light source device (6) according to a thirteenth aspect of the present invention includes: a driving circuit (11); a plurality of light emitting elements (the blue light emitting elements 30) made of a group III nitride semiconductor, each of which has a light outgoing surface on a side opposite to a side with the driving circuit, is arranged on the driving circuit, and is electrically connected to the driving circuit; a plurality of color conversion layers (the green conversion layer 40b and the red conversion layer 40c), which correspond one-to-one with the plurality of light emitting elements and each of which is in contact with the light outgoing surface of the corresponding light emitting element and converts a wavelength of light emitted from the light outgoing surface of the corresponding light emitting element; and a light absorbing layer (90) or a light reflecting layer which is arranged between the color conversion layers, and the light outgoing surface is made of a group III nitride semiconductor.

According to the above-described configuration, light components heading from each color conversion layer toward the adjacent color conversion layer decrease. This allows reduction in a situation where light emitted from the color conversion layer and light emitted from the adjacent color conversion layer from being mixed.

A light emitting device according to a fourteenth aspect of the present invention, in any one of the first, eleventh, and thirteenth aspects, includes the light source device.

The present invention is not limited to the above-described embodiments, and various changes can be made within the scope of the claims. An embodiment obtained by appropriately combining technical means disclosed in different embodiments is also included in the technical scope of the present invention. Additionally, a new technical feature can be formed by combining technical means disclosed in the embodiments.

The invention claimed is:

1. A light source device comprising:
a driving circuit;
an electrode electrically connected to the driving circuit;
a light emitting element that is electrically connected to the electrode is made of a group III nitride semiconductor, has a light outgoing surface on a side opposite to a side with the driving circuit, is arranged on the driving circuit, and is electrically connected to the driving circuit; and
a color conversion layer which is formed on or above the light outgoing surface and converts a wavelength of light emitted from the light outgoing surface, wherein
the light outgoing surface is made of a group III nitride semiconductor, wherein
the electrode includes a substrate-side electrode connected to a wiring included in the driving circuit and a light emitting element-side electrode connected to a terminal provided at the surface of the light emitting element, the substrate-side electrode and the light emitting element-side electrode are joined to each other, wherein
an entire lower surface of the light emitting element-side electrode is joined to a portion of an upper surface of the substrate-side electrode.

2. The light source device according to claim 1, wherein the light emitting element includes at least two light emitting elements, and the light outgoing surfaces of the plurality of light emitting elements lie in substantially a same plane.

3. The light source device according to claim 2, wherein the color conversion layer includes at least two types of color conversion layers such that light after conversion has different wavelengths.

4. The light source device according to claim 2, wherein a light-transmitting resin is formed on at least one of the light emitting elements.

5. The light source device according to claim 2, wherein the light outgoing surface of at least one of the light emitting elements is exposed.

6. The light source device according to claim 2, wherein a thickness of the color conversion layer along a direction from the driving circuit toward the light emitting element is different for each type of the color conversion layer.

7. The light source device according to claim 2, wherein a width of the color conversion layer along a direction orthogonal to a direction from the driving circuit toward the light emitting element is different for each type of the color conversion layer.

8. The light source device according to claim 2, wherein a concentration of a color conversion material contained in the color conversion layer is different for each type of the color conversion layer.

9. The light source device according to claim 1, wherein projections and recesses are formed at the light outgoing surface.

10. The light source device according to claim 2, further comprising:
a light blocking layer which is arranged between the light emitting elements, wherein
a surface of the light blocking layer on the side opposite to the side with the driving circuit and the light outgoing surface lie in substantially the same plane.

11. The light source device according to claim 1, wherein the color conversion layer is in contact with the light outgoing surface.

12. A light source device comprising:
a driving circuit;
an electrode that is electrically connected to the driving circuit;
a light emitting element that is electrically connected to the electrode is made of a group III nitride semiconductor, has a light outgoing surface on a side opposite to a side with the driving circuit, is arranged on the driving circuit, and is electrically connected to the driving circuit;

a phosphor layer which is formed on or above the light outgoing surface and converts a wavelength of light emitted from the light outgoing surface; and a color filter layer which is arranged on the phosphor layer, wherein the light outgoing surface is made of a group III nitride semiconductor, wherein the electrode includes a substrate-side electrode connected to a wiring included in the driving circuit and a light emitting element-side electrode connected to a terminal provided at the surface of the light emitting element, the substrate-side electrode and the light emitting element-side electrode are joined to each other, wherein an entire lower surface of the light emitting element-side electrode is joined to a portion of an upper surface of the substrate-side electrode.

13. The light source device according to claim 12, wherein the light emitting element includes at least two light emitting elements, and the phosphor layer is in contact with the respective light outgoing surfaces of the light emitting elements.

14. The light source device according to claim 12, wherein the phosphor layer is in contact with the light outgoing surface.

15. A light source device comprising:

a driving circuit;

a plurality of electrodes that are electrically connected to the driving circuit;

a plurality of light emitting elements, each of which is electrically connected to the electrode and is made of a group III nitride semiconductor, wherein each of the plurality of light emitting elements has a light outgoing surface on a side opposite to a side with the driving circuit, is arranged on the driving circuit, and is electrically connected to the driving circuit;

a plurality of color conversion layers, which correspond one-to-one with the plurality of light emitting elements and each of which is formed on or above the light outgoing surface of the corresponding light emitting element and converts a wavelength of light emitted from the light outgoing surface of the corresponding light emitting element; and a light absorbing layer or a light reflecting layer which is arranged between the color conversion layers, wherein the light outgoing surface is made of a group III nitride semiconductor, wherein each of the plurality of electrodes includes a substrate-side electrode connected to a wiring included in the driving circuit and a light emitting element-side electrode connected to a terminal provided at the surface of the light emitting element, the substrate-side electrode and the light emitting element-side electrode are joined to each other, wherein an entire lower surface of the light emitting element-side electrode is joined to a portion of an upper surface of the substrate-side electrode.

16. The light source device according to claim 15, wherein the color conversion layer is in contact with the light outgoing surface.

\* \* \* \* \*